United States Patent
Yamazaki et al.

(10) Patent No.: US 7,821,005 B2
(45) Date of Patent: Oct. 26, 2010

(54) METHOD OF MANUFACTURING SEMICONDUCTOR DEVICE AND SEMICONDUCTOR DEVICE

(75) Inventors: Shunpei Yamazaki, Tokyo (JP); Osamu Nakamura, Kanagawa (JP); Masayuki Kajiwara, Kanagawa (JP); Junichi Koezuka, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 11/404,923

(22) Filed: Apr. 17, 2006

(65) Prior Publication Data

US 2006/0255370 A1 Nov. 16, 2006

Related U.S. Application Data

(62) Division of application No. 10/020,961, filed on Dec. 19, 2001, now Pat. No. 7,045,444.

(30) Foreign Application Priority Data

| Dec. 19, 2000 | (JP) | ............................. 2000-384543 |
| Dec. 28, 2000 | (JP) | ............................. 2000-403098 |

(51) Int. Cl.
*H01L 29/10* (2006.01)
*H01L 29/76* (2006.01)
*H01L 31/112* (2006.01)

(52) U.S. Cl. ........................... 257/66; 257/75; 257/913; 257/E29.003; 257/E29.273; 257/E29.277

(58) Field of Classification Search .................. 257/65, 257/66, 70, 72, 75, 347, 913, E29.003, E29.004, 257/E29.273, E29.277

See application file for complete search history.

(56) References Cited

U.S. PATENT DOCUMENTS 3,535,775 A 10/1970 Garfinkel et al.

(Continued)

FOREIGN PATENT DOCUMENTS

EP 0 651 431 A2 5/1995

(Continued)

OTHER PUBLICATIONS

A. Ourmazd, "Gettering of Impurities in Silicon", Mat. Res. Soc. Symp. Proc., 1986, pp. 331-340, vol. 59, Materials Research Society.

(Continued)

*Primary Examiner*—Sue Purvis
*Assistant Examiner*—Leslie Pilar Cruz
(74) *Attorney, Agent, or Firm*—Nixon Peabody LLP; Jeffrey L. Costellia

(57) ABSTRACT

Phosphorus is implanted into a crystalline semiconductor film by an ion dope method. However, a concentration of phosphorus required for gettering is $1 \times 10^{20}/cm^3$ or higher which hinders recrystallization by later anneal, and thus this becomes a problem. Also, when phosphorus is added at a high concentration, processing time required for doping is increased and throughput in a doping step is reduced, and thus this becomes a problem. The present invention is characterized in that impurity regions to which an element belonging to the group 18 of the periodic table is added are formed in a semiconductor film having a crystalline structure and gettering for segregating in the impurity regions a metal element contained in the semiconductor film is performed by heat treatment. Also, a one conductivity type impurity may be contained in the impurity regions.

18 Claims, 24 Drawing Sheets

U.S. PATENT DOCUMENTS

| | | |
|---|---|---|
| 4,371,403 A | 2/1983 | Ikubo et al. |
| 4,477,308 A | 10/1984 | Gibson et al. |
| 4,529,621 A | 7/1985 | Ballard |
| 4,534,820 A | 8/1985 | Mori et al. |
| 5,244,819 A | 9/1993 | Yue |
| 5,270,264 A | 12/1993 | Andideh et al. |
| 5,275,896 A | 1/1994 | Garofalo et al. |
| 5,403,772 A | 4/1995 | Zhang et al. |
| 5,426,064 A | 6/1995 | Zhang et al. |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,508,533 A | 4/1996 | Takemura |
| 5,529,937 A | 6/1996 | Zhang et al. |
| 5,534,716 A | 7/1996 | Takemura |
| 5,543,352 A | 8/1996 | Ohtani et al. |
| 5,550,070 A * | 8/1996 | Funai et al. ............. 438/486 |
| 5,563,426 A | 10/1996 | Zhang et al. |
| 5,569,610 A | 10/1996 | Zhang et al. |
| 5,569,936 A | 10/1996 | Zhang et al. |
| 5,580,792 A | 12/1996 | Zhang et al. |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,620,910 A | 4/1997 | Teramoto |
| 5,621,224 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,663,077 A | 9/1997 | Adachi et al. |
| 5,677,549 A | 10/1997 | Takayama et al. |
| 5,696,003 A | 12/1997 | Makita et al. |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,712,203 A | 1/1998 | Hsu |
| 5,744,824 A | 4/1998 | Kousai et al. |
| 5,753,560 A * | 5/1998 | Hong et al. ............. 438/402 |
| 5,767,530 A | 6/1998 | Ha |
| 5,773,327 A | 6/1998 | Yamazaki et al. |
| 5,789,284 A | 8/1998 | Yamazaki et al. |
| 5,814,540 A | 9/1998 | Takemura et al. |
| 5,821,562 A * | 10/1998 | Makita et al. ............. 257/64 |
| 5,840,590 A | 11/1998 | Myers et al. |
| 5,843,225 A | 12/1998 | Takayama et al. |
| 5,851,860 A | 12/1998 | Makita et al. |
| 5,869,363 A | 2/1999 | Yamazaki et al. |
| 5,888,858 A | 3/1999 | Yamazaki et al. |
| 5,893,730 A | 4/1999 | Yamazaki et al. |
| 5,897,347 A | 4/1999 | Yamazaki et al. |
| 5,915,174 A | 6/1999 | Yamazaki et al. |
| 5,923,962 A | 7/1999 | Ohtani et al. |
| 5,932,893 A | 8/1999 | Miyanaga et al. |
| 5,949,115 A | 9/1999 | Yamazaki et al. |
| 5,956,579 A | 9/1999 | Yamazaki et al. |
| 5,961,743 A | 10/1999 | Yamazaki et al. |
| 5,970,327 A | 10/1999 | Makita et al. |
| 5,977,559 A | 11/1999 | Zhang et al. |
| 5,985,740 A | 11/1999 | Yamazaki et al. |
| 6,013,544 A | 1/2000 | Makita et al. |
| 6,022,458 A | 2/2000 | Ichikawa |
| 6,027,987 A | 2/2000 | Yamazaki et al. |
| 6,048,758 A | 4/2000 | Yamazaki et al. |
| 6,057,557 A | 5/2000 | Ichikawa |
| 6,063,654 A | 5/2000 | Ohtani |
| 6,066,518 A | 5/2000 | Yamazaki |
| 6,071,764 A | 6/2000 | Zhang et al. |
| 6,071,766 A | 6/2000 | Yamazaki et al. |
| 6,072,193 A | 6/2000 | Ohnuma et al. |
| 6,077,731 A | 6/2000 | Yamazaki et al. |
| 6,077,758 A | 6/2000 | Zhang et al. |
| 6,083,324 A * | 7/2000 | Henley et al. ............. 148/33.2 |
| 6,084,247 A | 7/2000 | Yamazaki et al. |
| 6,087,245 A | 7/2000 | Yamazaki et al. |
| 6,087,679 A | 7/2000 | Yamazaki et al. |
| 6,093,934 A | 7/2000 | Yamazaki et al. |
| 6,100,562 A | 8/2000 | Yamazaki et al. |
| 6,111,557 A | 8/2000 | Koyama et al. |
| 6,121,660 A | 9/2000 | Yamazaki et al. |
| 6,133,073 A | 10/2000 | Yamazaki et al. |
| 6,133,075 A | 10/2000 | Yamazaki et al. |
| 6,133,119 A | 10/2000 | Yamazaki |
| 6,153,445 A | 11/2000 | Yamazaki et al. |
| 6,156,590 A | 12/2000 | Yamazaki et al. |
| 6,156,628 A | 12/2000 | Ohnuma et al. |
| 6,157,421 A | 12/2000 | Ishii |
| 6,160,268 A | 12/2000 | Yamazaki |
| 6,162,667 A | 12/2000 | Funai et al. |
| 6,162,704 A | 12/2000 | Yamazaki et al. |
| 6,165,824 A | 12/2000 | Takano et al. |
| 6,168,980 B1 | 1/2001 | Yamazaki et al. |
| 6,180,439 B1 | 1/2001 | Yamazaki et al. |
| 6,184,559 B1 | 2/2001 | Hayakawa et al. |
| 6,194,255 B1 | 2/2001 | Hiroki et al. |
| 6,197,624 B1 | 3/2001 | Yamazaki |
| 6,201,585 B1 | 3/2001 | Takano et al. |
| 6,204,101 B1 | 3/2001 | Yamazaki et al. |
| 6,204,154 B1 | 3/2001 | Zhang et al. |
| 6,207,969 B1 | 3/2001 | Yamazaki |
| 6,218,219 B1 | 4/2001 | Yamazaki et al. |
| 6,225,152 B1 | 5/2001 | Yamazaki et al. |
| 6,232,205 B1 | 5/2001 | Ohtani |
| 6,232,621 B1 | 5/2001 | Yamazaki et al. |
| 6,242,290 B1 | 6/2001 | Nakajima et al. |
| 6,251,712 B1 | 6/2001 | Tanaka et al. |
| 6,255,195 B1 | 7/2001 | Linn et al. |
| 6,285,042 B1 | 9/2001 | Ohtani et al. |
| 6,287,900 B1 | 9/2001 | Yamazaki et al. |
| 6,291,275 B1 | 9/2001 | Yamazaki et al. |
| 6,294,441 B1 | 9/2001 | Yamazaki |
| 6,300,659 B1 | 10/2001 | Zhang et al. |
| 6,303,415 B1 | 10/2001 | Yamazaki |
| 6,303,963 B1 | 10/2001 | Ohtani et al. |
| 6,306,694 B1 | 10/2001 | Yamazaki et al. |
| 6,307,214 B1 | 10/2001 | Ohtani et al. |
| 6,316,789 B1 | 11/2001 | Yamazaki et al. |
| 6,316,810 B1 | 11/2001 | Yamazaki et al. |
| 6,337,259 B1 * | 1/2002 | Ueda et al. ............. 438/471 |
| 6,355,509 B1 | 3/2002 | Yamazaki |
| 6,376,336 B1 | 4/2002 | Buynoski |
| 6,383,852 B2 | 5/2002 | Zhang et al. |
| 6,391,690 B2 | 5/2002 | Miyasaka |
| 6,396,147 B1 | 5/2002 | Adachi et al. |
| 6,426,276 B1 | 7/2002 | Ohnuma et al. |
| 6,433,363 B1 | 8/2002 | Yamazaki et al. |
| 6,461,943 B1 | 10/2002 | Yamazaki et al. |
| 6,465,288 B1 | 10/2002 | Ohnuma |
| 6,478,902 B2 | 11/2002 | Koenigsmann et al. |

| | | | |
|---|---|---|---|
| 6,495,887 B1 * | 12/2002 | Krishnan et al. ............ 257/347 |
| 6,518,102 B1 | 2/2003 | Tanaka et al. |
| 6,542,143 B1 | 4/2003 | Ozawa |
| 6,551,907 B2 | 4/2003 | Ohtani |
| 6,555,448 B2 | 4/2003 | Fukushima |
| 6,592,771 B1 | 7/2003 | Yamanaka et al. |
| 6,599,785 B2 | 7/2003 | Hamada et al. |
| 6,620,711 B2 | 9/2003 | Yamazaki |
| 6,667,517 B1 * | 12/2003 | Yamazaki ................. 257/347 |
| 6,670,225 B2 | 12/2003 | Ohnuma |
| 6,670,259 B1 | 12/2003 | Chan |
| 6,709,955 B2 | 3/2004 | Saggio et al. |
| 6,787,407 B2 | 9/2004 | Nakamura et al. |
| 6,787,807 B2 | 9/2004 | Yamazaki et al. |
| 6,821,827 B2 | 11/2004 | Nakamura et al. |
| 6,830,617 B1 | 12/2004 | Ohtani et al. |
| 6,855,580 B2 | 2/2005 | Tanaka et al. |
| 7,115,452 B2 | 10/2006 | Yamazaki et al. |
| 7,384,860 B2 | 6/2008 | Nakamura et al. |
| 2001/0034088 A1 | 10/2001 | Nakamura et al. |
| 2002/0008286 A1 | 1/2002 | Yamazaki et al. |
| 2002/0014625 A1 | 2/2002 | Asami et al. |
| 2002/0038889 A1 | 4/2002 | Yamazaki et al. |
| 2002/0043662 A1 | 4/2002 | Yamazaki et al. |
| 2002/0094612 A1 | 7/2002 | Nakamura et al. |
| 2002/0098628 A1 | 7/2002 | Hamada et al. |
| 2002/0102764 A1 | 8/2002 | Yamazaki et al. |
| 2002/0102776 A1 | 8/2002 | Yamazaki et al. |
| 2002/0125480 A1 | 9/2002 | Nakamura et al. |
| 2002/0134981 A1 | 9/2002 | Nakamura et al. |
| 2002/0151120 A1 | 10/2002 | Yamazaki et al. |
| 2002/0155652 A1 | 10/2002 | Yamazaki et al. |
| 2002/0182783 A1 | 12/2002 | Takayama et al. |
| 2002/0182785 A1 | 12/2002 | Miyairi |
| 2002/0182828 A1 | 12/2002 | Asami et al. |
| 2002/0197785 A1 | 12/2002 | Yamazaki et al. |
| 2003/0008439 A1 | 1/2003 | Ohnuma |
| 2003/0082859 A1 | 5/2003 | Ichijo et al. |
| 2003/0089911 A1 | 5/2003 | Kasahara et al. |
| 2003/0122129 A1 | 7/2003 | Yamazaki et al. |

FOREIGN PATENT DOCUMENTS

| | | |
|---|---|---|
| EP | 0 840 367 A2 | 5/1998 |
| JP | 05-109737 | 4/1993 |
| JP | 7-130652 | 5/1995 |
| JP | 7-183540 | 7/1995 |
| JP | 08-078329 | 3/1996 |
| JP | 08-236471 | 9/1996 |
| JP | 08-330602 | 12/1996 |
| JP | 9-074207 | 3/1997 |
| JP | 10-135226 | 5/1998 |
| JP | 10-223533 | 8/1998 |
| JP | 10-223534 | 8/1998 |
| JP | 10-242475 | 9/1998 |
| JP | 11-054760 | 2/1999 |
| JP | 11-297703 | 10/1999 |
| JP | 11-329970 | 11/1999 |
| JP | 3032801 | 2/2000 |
| JP | 3032801 | 4/2000 |
| JP | 2000-133594 | 5/2000 |
| JP | 2000-260777 | 9/2000 |
| JP | 2001-210828 | 8/2001 |
| JP | 2001-250777 | 9/2001 |

OTHER PUBLICATIONS

A. Ourmazd et al., "Gettering of Metallic Impurities in Silicon", Mat. Res. Soc. Symp. Proc., 1985, pp. 25-30, vol. 36, Materials Research Society.

K. Graff et al., "Palladium-Test: A Tool to Evaluate Gettering Efficiency", Mat. Res. Soc. Symp. Proc., 1985, pp. 19-24, vol. 36, Materials Research Society.

E. G. Colas et al., "Quantitative Study of Metal Gettering in Silicon", Mat. Res. Soc. Symp. Proc., 1986, pp. 341-346, vol. 59, Materials Research Society.

IEEE Transactions on Electron Devices, "*Characteristics of Buried-Channel pMOS Devices with Shallow Counter-Doped Layers Fabricated Using Channel Preamorphization*" Miyake et al.; vol. 43, No. 3, Mar. 1996; pp. 444-449.

IEEE Transactions on Electron Devices, "*Argon Ion-Implantation on Polysilicon or Amorphous-Silicon for Boron Penetration Suppression in $p^+pMOSFET$*" Lee et al. vol. 45, No. 8, Aug. 1998.

U.S. Appl. No. 10/072,931, filed Feb. 12, 2002—Filing Receipt, Specification, Claims and Drawings.

U.S. Appl. No. 10/056,055, filed Jan. 28, 2002, Filing receipt, Specification, Claims and Drawings.

U.S. Appl. No. 10/074,050, filed Feb. 14, 2002, Filing Receipt, Specification, Claims and Drawings.

U.S. Appl. No. 10/051,064, filed Jan. 18, 2002, Filing Receipt, Specification, Claims and Drawings.

U.S. Appl. No. 10/097,641, filed Mar. 15, 2002, Filing Receipt, Specification, Claims and Drawings.

U.S. Appl. No. 10/066,542, filed Feb. 5, 2002, Filing Receipt, Specification, Claims and Drawings.

D.J. Llewellyn et al. *IEEE 1997*, "*Implantation and annealing of Cu in InP for electrical isolation: microstructural characterization, optoelectronic and microelectronic materials and devices proceedings*" pp. 313-316.

Kevin Jones et al. *IEEE 2000*, "*Boron Diffusion upon Annealing of Laser Thermal Processed Silicon*", Ion Implantation Technology 2000, pp. 111-114.

Lee et al., *IEEE* Transactions on Electron Devices, "*Argon Ion-Implantation on Polysilicon or Amorphous-Silicon for Boron Penetration Suppression in p+ pMOSFET*", vol. 45, No. 8, Aug. 1998, pp. 1737-1744.

* cited by examiner

Fig. 6A
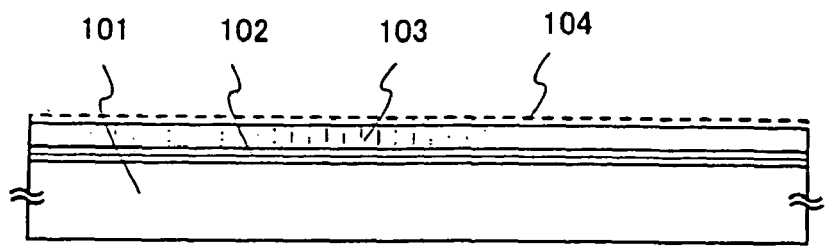
Fig. 6B irradiation of first intense light
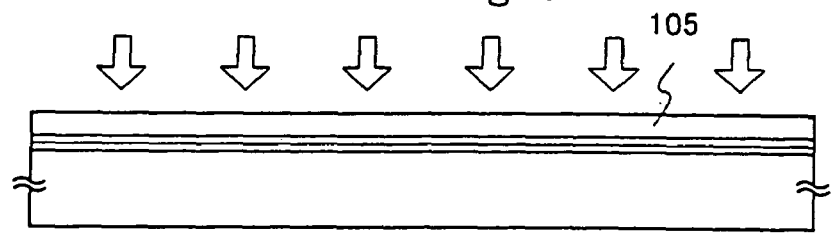
Fig. 6C irradiation of laser light
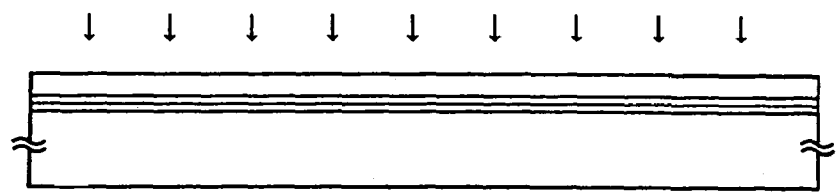
Fig. 6D irradiation of second intense light
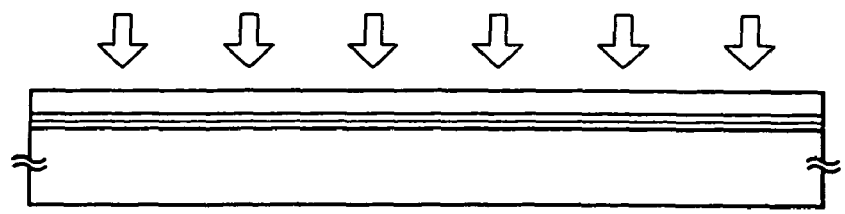

Fig. 7A ion addition
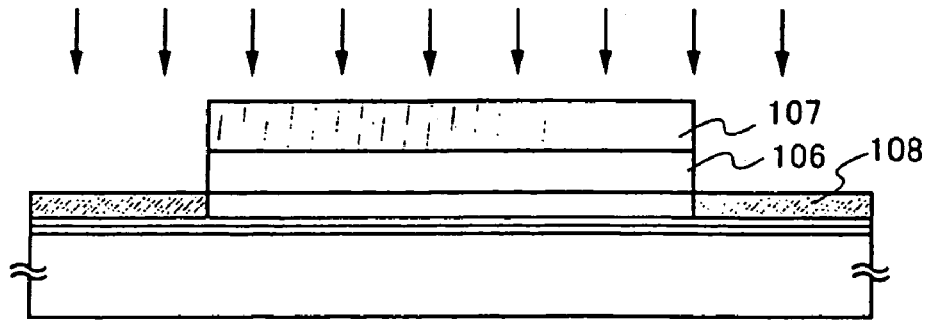
Fig. 7B heat treatment (gettering)
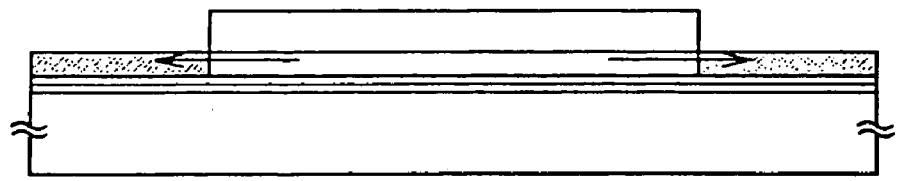
Fig. 7C paterning
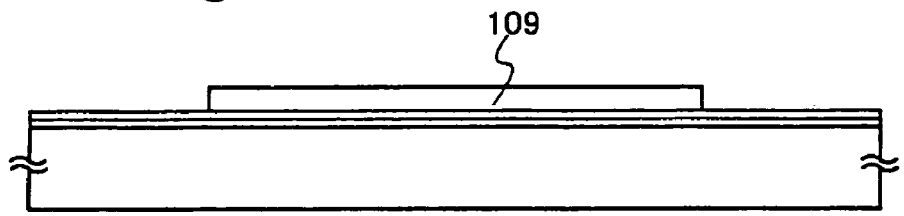
Fig. 7D
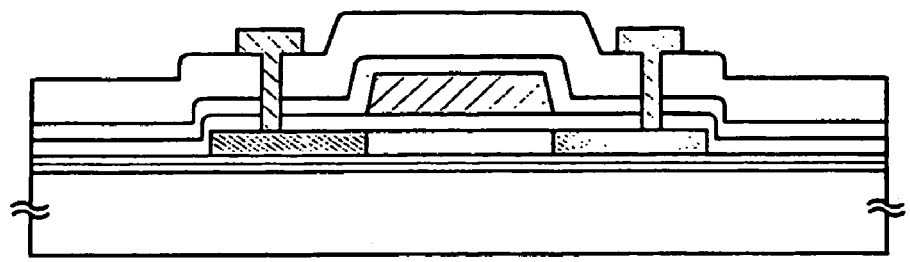

Fig. 8A
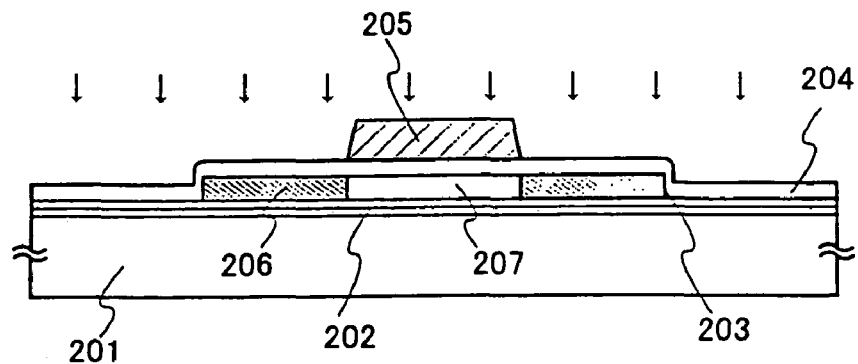
Fig. 8B
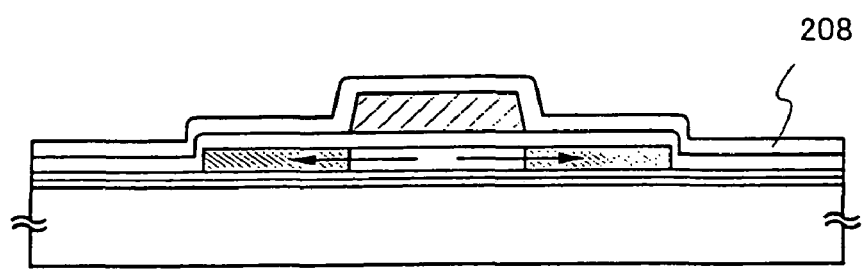
Fig. 8C activation
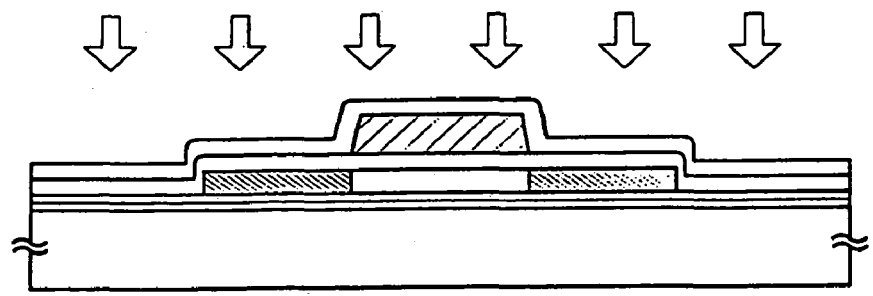

Fig. 9A
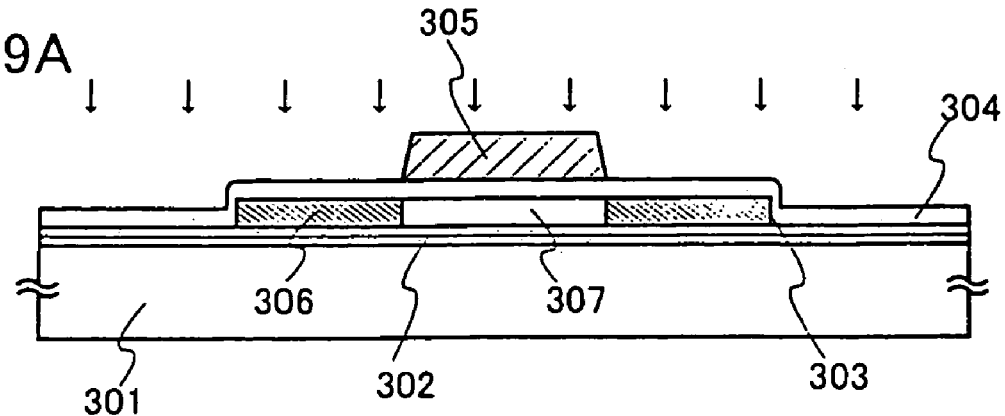
Fig. 9B heat treatment (gettering)
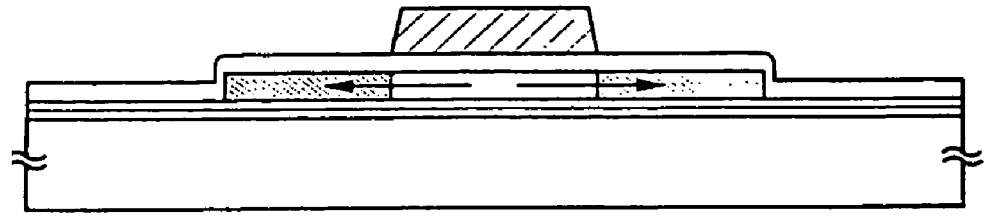
Fig. 9C hydrogenation
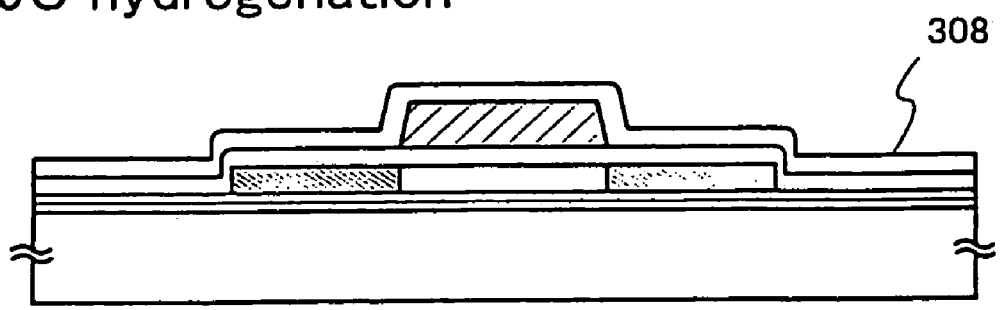

Fig. 13C1 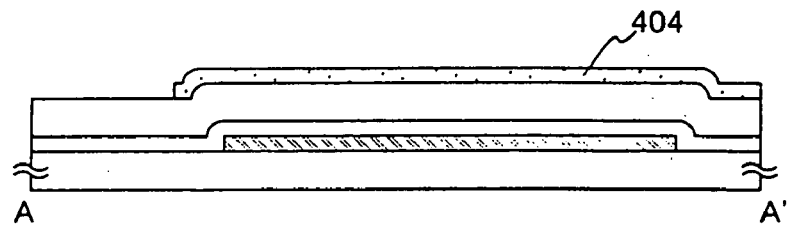
Fig. 13C2 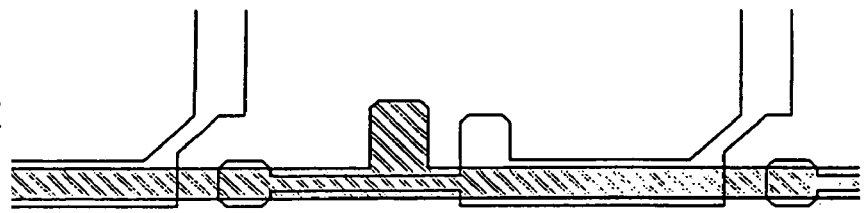
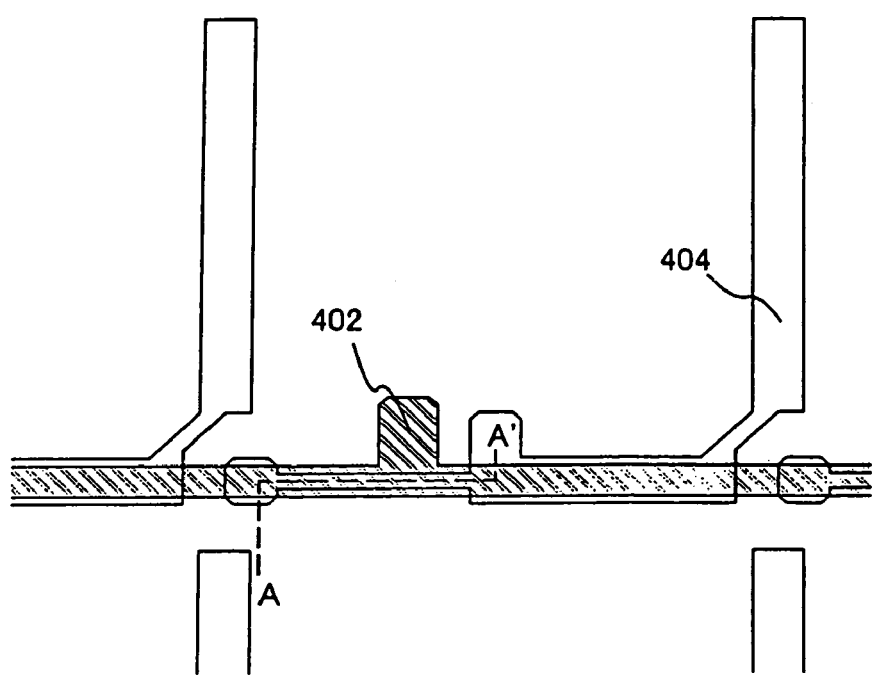

Fig. 14C1 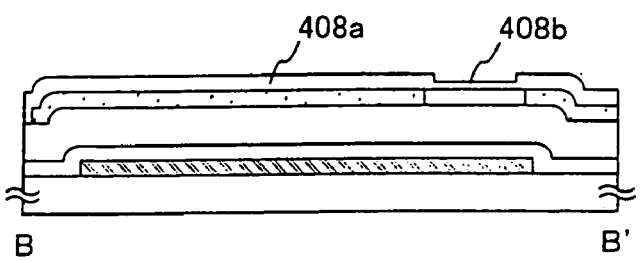
Fig. 14C2 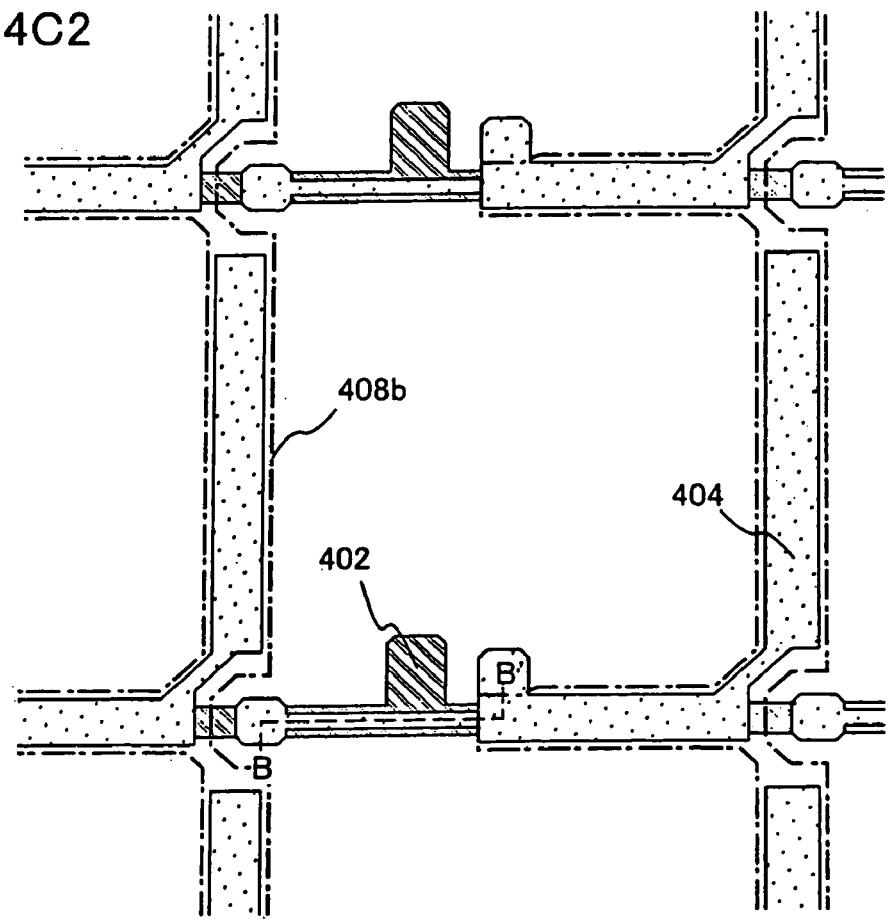

Fig. 15A
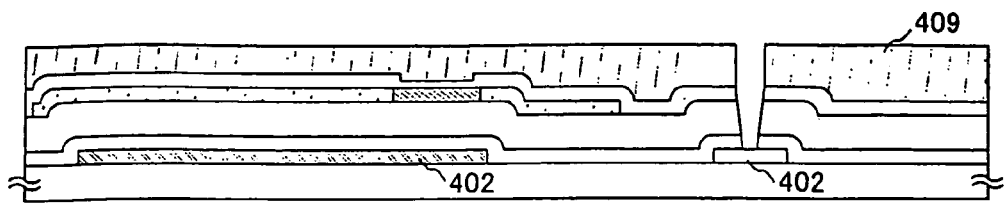
Fig. 15B
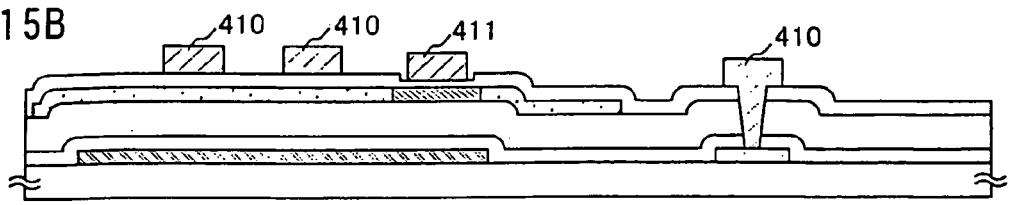
Fig. 15C1
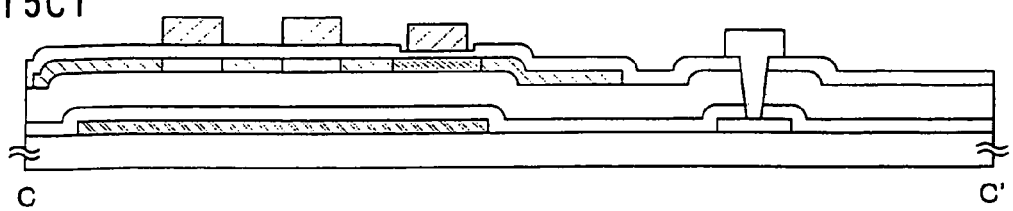
Fig. 15C2
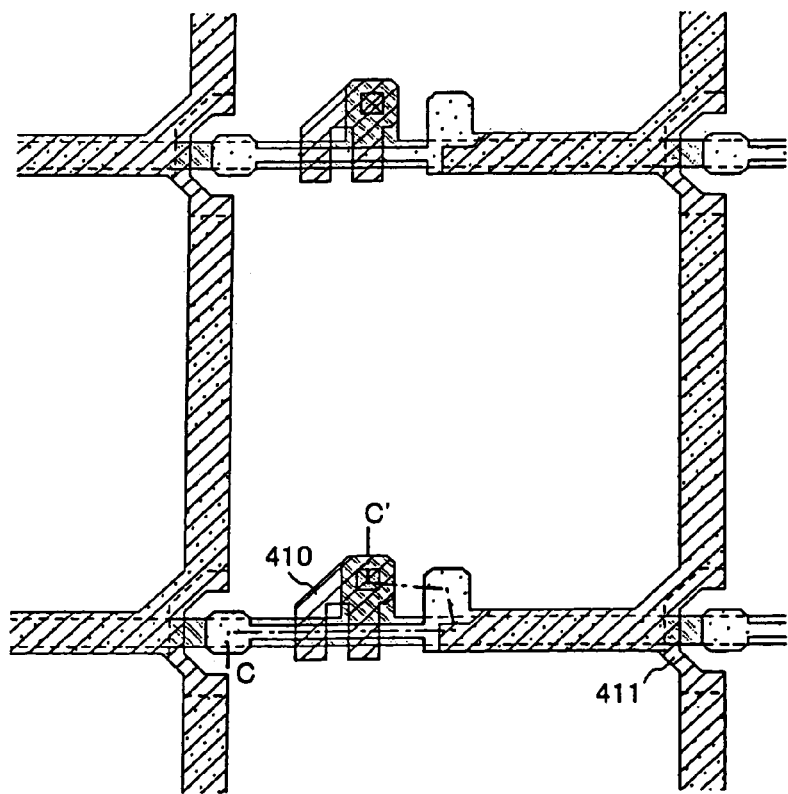

Fig. 16A
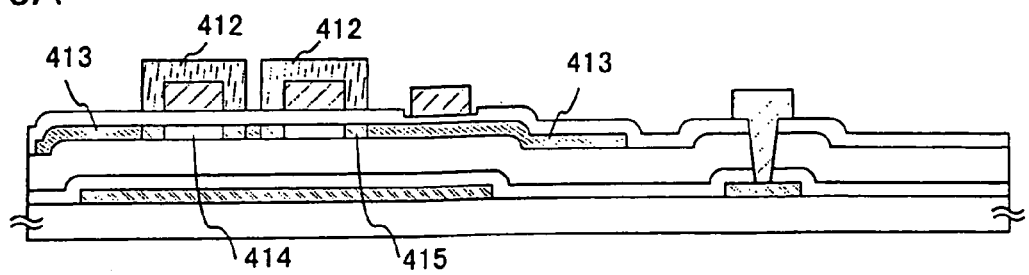
Fig. 16B1
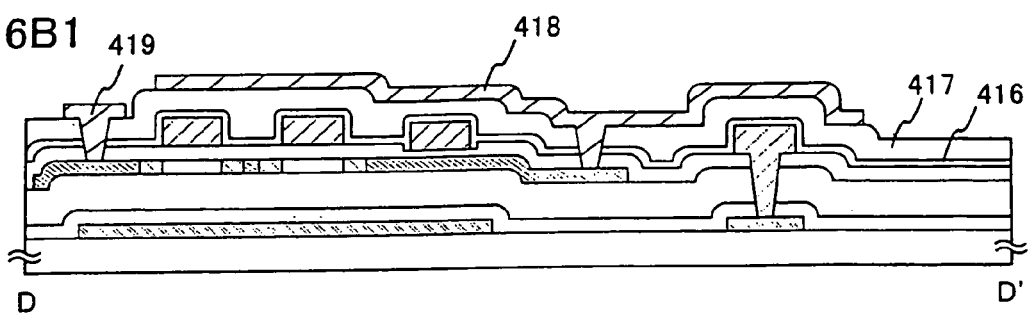
Fig. 16B2
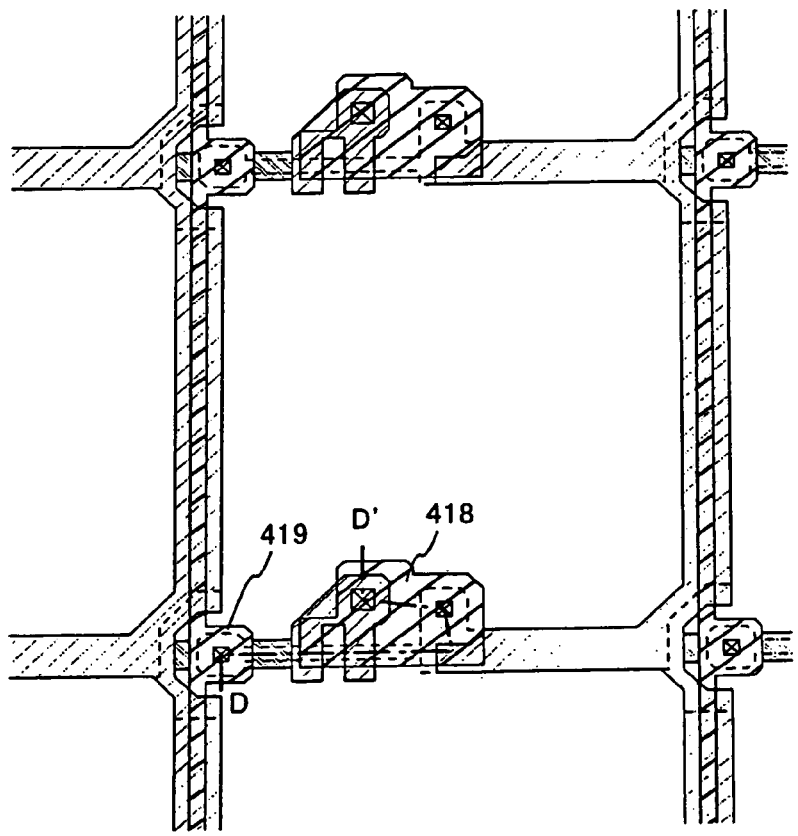

Fig. 17A1
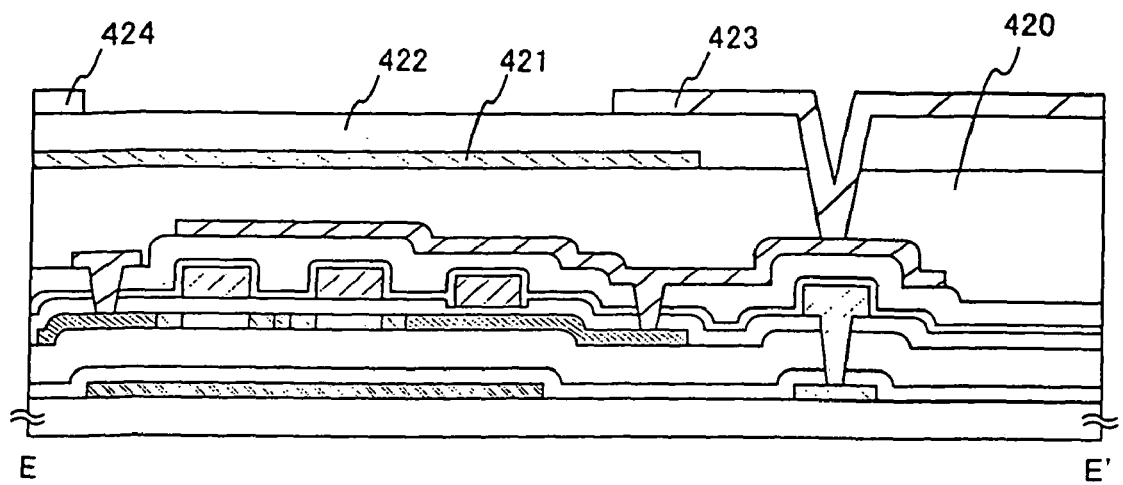
Fig. 17A2
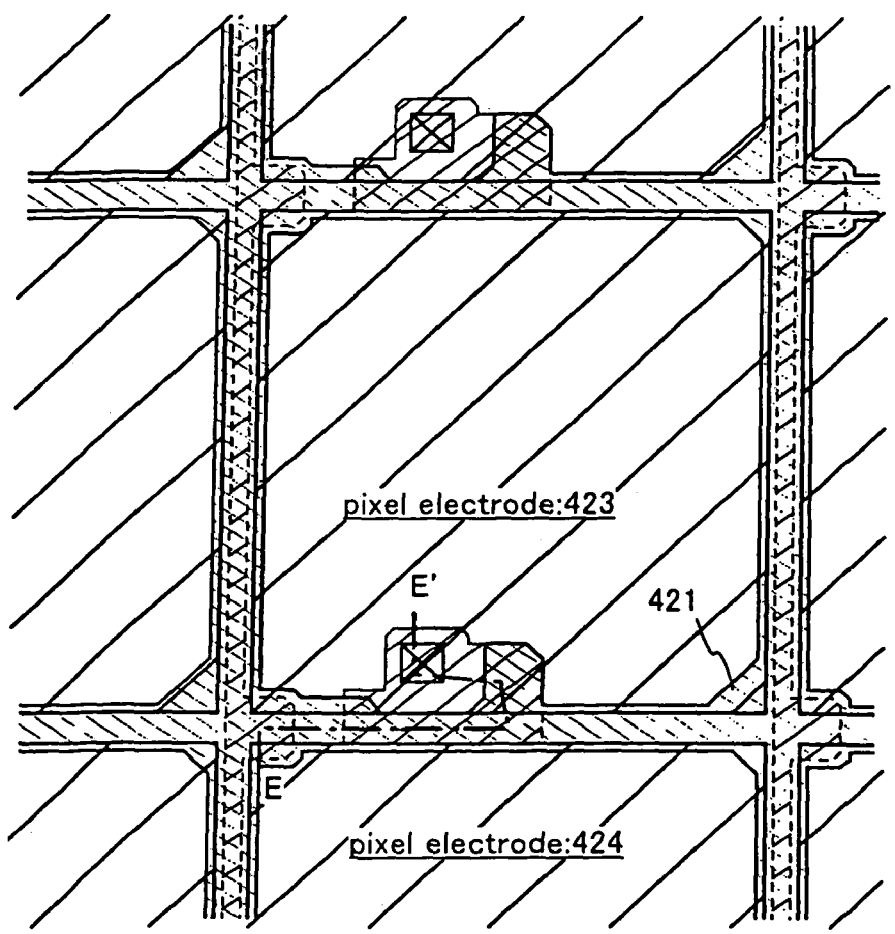

comparison of argon concentration between before and after anneal comparison of nickel concentration between before and after anneal 1001 reflection electrode before gettering anneal after gettering anneal Ion_1 [uA]

Ioff_1 [pA]

Vth [V]

S-value [V/dec.]

μFE_1(max) [cm2/Vs]

METHOD OF MANUFACTURING SEMICONDUCTOR DEVICE AND SEMICONDUCTOR DEVICE

BACKGROUND OF THE INVENTION

1. Field of the Invention

The present invention relates to a method of manufacturing a semiconductor device using a gettering technique and a semiconductor device obtained by the manufacturing method. More particularly, the present invention relates to a method of manufacturing a semiconductor device using a crystalline semiconductor film produced by adding a metal element having catalysis to crystallization of a semiconductor film and a semiconductor device.

2. Description of the Related Art

A thin film transistor (hereinafter referred to as a TFT) is known as a typical semiconductor element using a semiconductor film having a crystalline structure (hereinafter referred to as a crystalline semiconductor film). The TFT is noted as a technique for forming an integrated circuit on an insulating substrate made of glass or the like, and a driver circuit integrated liquid crystal display device and the like are putting into practical use. According to a conventional technique, an amorphous semiconductor film deposited by a plasma CVD method or a low pressure CVD method is processed by heat treatment or a laser anneal method (technique for crystallizing a semiconductor film by laser light irradiation) to produce the crystalline semiconductor film.

Since the crystalline semiconductor film thus produced is an aggregate of a large number of crystal grains, and its crystal orientation is oriented in an arbitrary direction which is thus uncontrollable, this causes a reduction in a characteristic of the TFT. To solve such a problem, a technique disclosed in Japanese Patent Application Laid-open No. Hei 7-1883540 is one performed by adding a metal element having catalysis, such as nickel, in crystallization of an amorphous semiconductor film, and orientation property of the crystal orientation can be improved to be a single direction, in addition to an effect of decreasing a heating temperature required for the crystallization. When a TFT is made from a crystalline semiconductor film produced by this method, a reduction in a subthreshold coefficient (S value) and improvements of a static characteristic and a dynamic characteristics become possible in addition to an improvement of electric field effect mobility.

However, since a metal element having catalysis is added, there is such a problem that the metal element is left in the inner portion or the surface of the crystalline semiconductor film, and thus a characteristic of an obtained TFT is varied. One example is increase of an off current and there is such a problem that a variation between the individual TFTs is caused. That is, the metal element having catalysis to crystallization conversely becomes unnecessary once the crystalline semiconductor film has been formed.

Gettering using phosphorus is effectively used as a method of removing such a metal element from a specific region of the crystalline semiconductor film. For example, phosphorus is added to a source and a drain regions of a TFT and then heat treatment is performed at 450 to 700° C., whereby the metal element can be easily removed from the channel forming region.

Phosphorus is implanted to the crystalline semiconductor film by an ion dope method (which is a method of dissociating $PH_3$ or the like with plasma and accelerating ions of $PH_3$ by an electric field to implant it into a semiconductor, and a method in which ion mass separation is not basically performed). A concentration of phosphorus required for gettering is $1 \times 10^{20}$/ $cm^3$ or higher. Addition of phosphorus by the ion dope method causes the crystalline semiconductor film to be amorphous. However, when the concentration of phosphorus is increased, a problem in which recrystallization by later anneal is hindered is caused. Also, since the addition of high concentration phosphorus causes an increase in a processing time required for doping, a problem in which throughput in a doping process is decreased is caused.

Further, a concentration of boron required for inverting a conductivity type is 1.5 to 3 times higher than that of phosphorus added to a source region and a drain region of a p-channel TFT. Thus, a problem in which resistances of the source region and the drain region are increased according to difficulty of recrystallization is caused.

SUMMARY OF THE INVENTION

The present invention is a means for solving such problems, and an object of the present invention is to provide a technique for easily removing a metal element left in a crystalline semiconductor film obtained using the metal element having catalysis to crystallization of an amorphous semiconductor film.

A gettering technique is positioned as a main technique in manufacturing techniques of an integrated circuit using a single crystalline silicon wafer. The gettering is known as a technique in which a metal impurity taken in a semiconductor is segregated in a gettering site by some energy to reduce a concentration of the impurity present in an active region of an element. The gettering techniques are broadly divided into extrinsic gettering and intrinsic gettering. The extrinsic gettering produces a gettering effect by providing a chemical action or a distortion field from the outside. Gettering for diffusing phosphorus having a high concentration from the rear surface of the single crystalline silicon wafer corresponds to this extrinsic gettering, and the above gettering using phosphorus to the above-mentioned crystalline semiconductor film can be assumed as a kind of extrinsic gettering. On the other hand, the intrinsic gettering is known as a technique utilizing a distortion field of lattice defect being related to oxygen produced in the inner portion of the single crystalline silicon wafer. The present invention focuses on gettering utilizing the lattice defect or the lattice distortion and which uses the following means for application to the crystalline semiconductor film with a thickness of about 10 to 100 nm.

The present invention is characterized in that an impurity region to which a noble gas element belonging to the group 18 of the periodic table is added is formed in a semiconductor film having a crystalline structure, and gettering for segregating in the impurity region a metal element included in the semiconductor film by heat treatment is produced. Also, a one conductivity type impurity, such as phosphorus or boron, may be contained in the impurity region.

A noble gas element preferably used in particular in the present invention is one kind or plural kinds of elements selected from the group consisting of He, Ne, Ar, Kr, and Xe. These ions are accelerated by an electric field to be implanted into the semiconductor film, whereby dangling bond and lattice distortion are produced to make it possible to form a gettering site. Also, an element belonging to the group 15 or group 13 of the periodic table is applied as a one conductivity type impurity element and may be contained in the region to which the noble gas element is added.

A method of manufacturing a crystalline semiconductor film, including gettering processing using this noble gas element, comprises a first step of adding a metal element to a semiconductor film having an amorphous structure; a second step of crystallizing the semiconductor film by first heat treatment to form a crystalline semiconductor film; a third step of forming in the crystalline semiconductor film an impurity region to which a noble gas element is added; and a fourth step of performing gettering for segregating in the impurity region the metal element included in the crystalline semiconductor film by a second heat treatment after the third step. In the third step, selective addition of the noble gas element can be performed by forming a mask insulating film having an opening. Also, after the second heat treatment is completed, the impurity region to which the noble gas element is added is removed and a semiconductor region in which a concentration of the added metal element is reduced can be formed as the crystalline semiconductor film having a desired shape.

Also, a manufacturing method of the present invention includes: a first step of selectively adding a metal element to a first region of a semiconductor film having an amorphous structure: a second step of crystallizing the semiconductor film by first heat treatment to form a crystalline semiconductor film; a third step of adding in the first region of the crystalline semiconductor film a noble gas element; and a fourth step of performing gettering for segregating in the first region the metal element contained in the second semiconductor film by second heat treatment after the third step. After the second heat treatment is completed, the impurity region to which the noble gas element is added is removed and a semiconductor region in which a concentration of the added metal element is reduced can be formed as the crystalline semiconductor film having a desired shape.

Also, a method of manufacturing a crystalline semiconductor film by gettering using a noble gas element according to the present invention is characterized in that an impurity reunion to which a noble gas element (also called a noble gas) is added is formed in a crystalline semiconductor film and gettering for segregating in the impurity region a metal element contained in the semiconductor film by heat treatment is performed, and then the semiconductor film having the crystalline structure is irradiated with intense light. The noble gas element is one kind or plural kinds of elements selected from the group consisting of He, Ne, Ar, Kr, and Xe. These ions are accelerated by an electric field to be implanted into the semiconductor film, whereby dangling bond and lattice distortion are produced to make it possible to form a gettering site.

A one conductivity type impurity may be added to the impurity region to which the noble gas element is added, and thus both the noble gas element and the one conductivity type impurity are contained in the impurity region. An element belonging to the group 15 or group 13 of the periodic table is applied as the one conductivity type impurity. In addition, hydrogen may be added to the impurity region, and the noble gas element, the one conductivity type impurity, and hydrogen are all contained in the impurity region.

An element belonging to the group 15 of the periodic table and an element belonging to the group 13 thereof may be added to the impurity region to which the noble gas element is added, and the noble gas element, the element belonging to the group 15 of the periodic table and the element belonging to the group 13 thereof are all included in the impurity region.

An element belonging to the group 15 of the periodic table and an element belonging to the group 13 thereof, and hydrogen may be added to the impurity region to which the noble gas element is added, and thus the noble gas element, the element belonging to the group 15 of the periodic table, the element belonging to the group 13 thereof, and hydrogen are all contained in the impurity region.

Thus, a method of manufacturing a crystalline semiconductor film using a noble gas element comprises a first step of adding a metal element to a first semiconductor film having an amorphous structure; a second step of crystallizing the first semiconductor film by first heat treatment to form a second semiconductor film having a crystalline structure; a third step of forming an impurity region to which the noble gas element is added in the second semiconductor film; a fourth step of performing gettering for segregating in the impurity region the metal element contained in the second semiconductor film by second heat treatment after the third step; and a fifth step of irradiating the semiconductor film having the crystalline structure with intense light.

Alternatively, a manufacturing method of the present invention comprises: a first step of adding a metal element to a first semiconductor film having an amorphous structure; a second step of crystallizing the first semiconductor film by first heat treatment to form a second semiconductor film having a crystalline structure; a third step of forming an impurity region to which a one conductivity type impurity and a noble gas element are added in the second semiconductor film; a fourth step of performing gettering for segregating in the impurity region, the metal element contained in the second semiconductor film by second heat treatment after the third step; and a fifth step of irradiating the semiconductor film having the crystalline structure with intense light.

Alternatively, a manufacturing method of the present invention comprises: a first step of adding a metal element to a first semiconductor film having an amorphous structure; a second step of crystallizing the first semiconductor film by first heat treatment to form a second semiconductor film having a crystalline structure; a third step of forming an impurity region to which the element belonging to the group 15 of the periodic table, the element belonging to the group 13 thereof, and the noble gas element are added in the second semiconductor film; a fourth step of performing gettering for segregating in the impurity region the metal element contained in the second semiconductor film by second heat treatment after the third step; and a fifth step of irradiating the semiconductor film having the crystalline structure with intense light.

Further, in the present invention, the metal element may be selectively added using a mask made of a resist or a silicon oxide film.

Also, the present invention includes: a first step of selectively adding a metal element to a first region of a first semiconductor film having an amorphous structure; a second step of crystallizing the first semiconductor film by first heat treatment to form a second semiconductor film having a crystalline structure; a third step of adding a noble gas element to the first region in the second semiconductor film; a fourth step of performing gettering for segregating in the first region the metal element contained in the second semiconductor film by second heat treatment after the third step; and a fifth step of irradiating the semiconductor film having the crystalline structure with intense light.

Alternatively, a manufacturing method of the present invention comprises a first step of selectively adding a metal element to a first region of a first semiconductor film having an amorphous structure; a second step of crystallizing the first semiconductor film by first heat treatment to form a second semiconductor film having a crystalline structure; a third step of adding a one conductivity type impurity element and a noble gas element to the first region in the second semiconductor film; a fourth step of performing gettering for segregating in the first region the metal element contained in the second semiconductor film by second heat treatment after the third step; and a fifth step of irradiating the semiconductor film having the crystalline structure with intense light.

Alternatively, a manufacturing method of the present invention comprises a first step of selectively adding a metal element to a first region of a first semiconductor film having an amorphous structure; a second step of crystallizing the first semiconductor film by first heat treatment to form a second semiconductor film having a crystalline structure; a third step of adding an element belonging to the group 15 of the periodic table, an element belonging to the group 13 thereof, and a noble gas element to the first region in the second semiconductor film; a fourth step of performing gettering for segregating in the first region the metal element contained in the second semiconductor film by second heat treatment after the third step; and a fifth step of irradiating the semiconductor film having the crystalline structure with intense light.

A semiconductor device manufactured through such steps is characterized in that both the metal element and the noble gas element are contained in a one conductivity type impurity region. In addition, hydrogen may be contained in the one conductivity type impurity region.

Alternatively, a semiconductor device is characterized in that a one conductivity type impurity region and a channel forming region which is in contact with the one conductivity type impurity region are provided in a semiconductor film having a crystalline structure; and both the metal element and the noble gas element are contained in the one conductivity type impurity region. In addition, hydrogen may be contained in the one conductivity type impurity region.

Alternatively, a semiconductor device is characterized in that: a second impurity region which is in contact with a first one conductivity type impurity region is provided: and the metal element and the noble gas element are both contained in the second impurity region. In addition, hydrogen may be included in the second impurity region.

Alternatively, a semiconductor device is characterized in that: a first one conductivity type impurity region, a second impurity region which is in contact with the first impurity region, and a channel forming region which is in contact with the first impurity region are provided in a semiconductor film having a crystalline structure; and the metal element and the noble gas element are both contained in the second impurity region. In addition, hydrogen may be contained in the second impurity region.

Alternatively, a semiconductor device is characterized in that: a first one conductivity type impurity region, a second impurity region which is in contact with the first impurity region; and a channel forming region which is in contact with the first impurity region are provided in a semiconductor film having a crystalline structure and the metal element, the element belonging to the group 15 of the periodic table, the element belonging to the group 13 thereof, and the noble gas element are contained in the second impurity region. In addition, hydrogen may be contained in the second impurity region.

In the above structure of the present invention, the metal element is one kind or plural kinds of elements selected from the group consisting of iron (Fe), nickel (Ni), cobalt (Co), ruthenium (Ru), rhodium (Rh), palladium (Pd), osmium (Os), iridium (Ir), platinum (Pt), copper (Cu), and gold (Au).

In the above respective structures of the present invention, the intense light is one of infrared light, visible light, or ultraviolet light. Also, the intense light indicates light which has a wavelength of 10 ìm or less and in which a main wavelength region is an infrared light region, and may be light emitted from, for example, a halogen lamp, a metal halide lamp, a xenon arc lamp, a carbon arc lamp, or a mercury lamp.

A heat treatment method by the intense light using the above as light sources is called rapid thermal anneal (hereinafter referred to as RTA) and known as a heat treatment technique for performing rapid heating for several microseconds of seconds to several tens. Further, the intense light may be light emitted from one of an excimer laser, a YAG laser, a $YVO_4$ laser, or a YLF laser. The intense light is irradiated, whereby the resistance value of the semiconductor film having the crystalline structure can be reduced.

Also, the present invention provides a technique for forming the semiconductor film having the crystalline structure. That is, there is provided a method of manufacturing a semiconductor device, characterized by comprising the steps of: adding a metal element to a semiconductor film having an amorphous structure; irradiating the semiconductor film having the amorphous structure with first intense light to form a semiconductor film having a crystalline structure; irradiating the semiconductor film having the crystalline structure with laser light; irradiating the semiconductor film having the crystalline structure with second intense light; forming an impurity region to which a noble gas element is added in the semiconductor film having the crystalline structure; and performing gettering for segregating in the impurity region the metal element contained in the semiconductor film.

In the above structure, it is characterized in that the gettering step is heat treatment.

Also, in the above structure, the gettering step may be processing for irradiating the semiconductor film having the crystalline structure with intense light. In this case, the semiconductor film having the crystalline structure can be obtained without using a furnace.

Also, when heat treatment or intense light irradiation is performed plural times, flattening of a ridge formed in the semiconductor film can be made.

Also, in the above structure, one kind or plural kinds of elements selected from the group consisting of an element belonging to the group 15 of the periodic table, an element belonging to the group 13 thereof, and hydrogen may be added in addition to the noble gas element.

A semiconductor device manufactured through such steps above comprises: a semiconductor region made from a crystalline semiconductor film; a gate insulating film; and a gate electrode; a channel forming region and an impurity region which is in contact with the channel forming region and to which a one conductivity type impurity element is added, are formed in the crystalline semiconductor film; and the one conductivity type impurity region containing a noble gas element.

Alternatively, a semiconductor film comprises: a semiconductor region made from a crystalline semiconductor film; a gate insulating film; and a gate electrode; the crystalline semiconductor film having a channel forming region, a first impurity region which is in contact with the channel forming region and to which a one conductivity type impurity element is added, a second impurity region to which a one conductivity type impurity element and a noble gas element are added.

Also, another structure comprises: a crystalline semiconductor film formed by adding a metal element to a semiconductor film having an amorphous structure; a semiconductor region made of the crystalline semiconductor film; a gate insulating film; a gate electrode; a channel forming region and an impurity region which is in contact with the channel forming region and to which a one conductivity type impurity element is added, formed in the crystalline semiconductor film, and the structure is the one in which the one conductivity type impurity region contains a noble gas element and the metal element at a higher concentration than the channel forming region.

Alternatively, another structure includes: a semiconductor region having a crystalline semiconductor film produced by adding a metal element to a semiconductor film having an amorphous structure and made from the crystalline semiconductor film: a gate insulating film; and a gate electrode, the crystalline semiconductor film has a channel forming region, a first impurity region which is in contact with the channel forming region and to which a one conductivity type impurity element is added, and a second impurity region to which the one conductivity type impurity element and a noble gas element are added, and the second impurity region contains the metal element at a higher concentration than the channel forming region.

As described above, the present invention provides a technique for performing gettering of a metal element contained in a semiconductor film using a noble gas element. Hereinafter, the present invention will be described in more detail based on embodiment modes.

BRIEF DESCRIPTION OF THE DRAWINGS

In the accompanying drawings:

FIGS. 6A to 6D are explanatory views for a method of manufacturing a crystalline semiconductor film according to the present invention;

FIGS. 7A to 7D are explanatory views for a method of manufacturing the crystalline semiconductor film according to the present invention;

FIGS. 8A to 8C are explanatory views for a method of manufacturing the semiconductor device by the gettering method using the noble gas element;

FIGS. 9A to 9C are explanatory views for a method of manufacturing the semiconductor device by the gettering method using the noble gas element;

FIGS. 13A to 13C2 are cross sectional views and a top surface view for a step of manufacturing a pixel portion;

FIGS. 14A to 14C2 are cross sectional views and a top surface view for the step of manufacturing the pixel portion;

FIGS. 15A to 15C2 are cross sectional views and a top surface view for the step of manufacturing the pixel portion;

FIGS. 16A to 16B2 are cross sectional views and a top surface view for the step of manufacturing the pixel portion;

FIGS. 17A1 and 17A2 are a cross sectional view and a top surface view for the step of manufacturing the pixel portion;

DETAILED DESCRIPTION OF THE PREFERRED EMBODIMENTS

As described above, the present invention provides the technique for gettering the metal element included in the semiconductor film using the noble gas element. Hereinafter, the present invention will be described in details through the embodiment modes.

Embodiment Mode 1

Figure 1A:
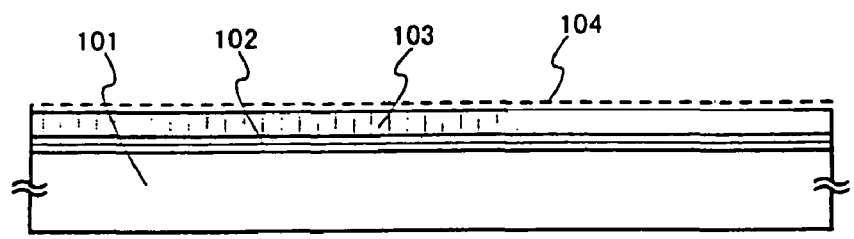
FIGS. 1A to 1C are explanatory views for a method of forming a crystalline semiconductor film according to the present invention.
Figure 1B:
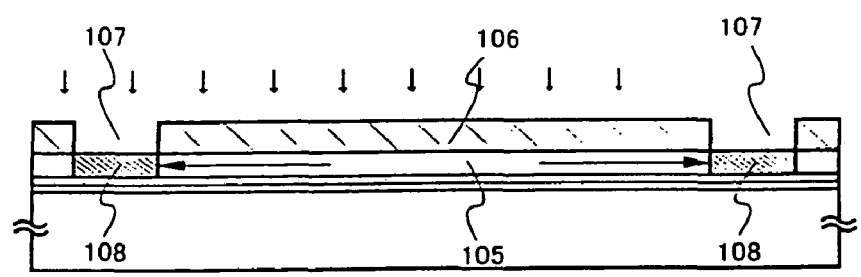
Figure 1C:
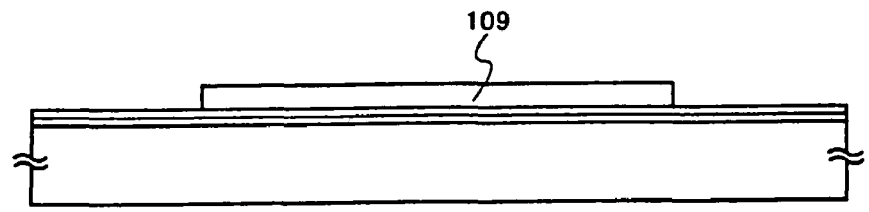

FIGS. 1A to 1C are explanatory views of one embodiment mode of the present invention and show a method of adding a metal element having catalysis onto the entire surface of an amorphous semiconductor film to crystallize it and then performing gettering. In FIG. 1A, barium borosilicate glass, aluminoborosilicate glass, quartz, or the like can be used for a substrate 101. An inorganic insulating film is formed as a blocking layer 102 with a thickness of 10 to 200 nm on the surface of the substrate 101. One example of a preferable blocking layer is a silicon oxynitride film produced by a plasma CVD method and a laminate of a first silicon oxynitride film produced from $SiH_4$, $NH_3$, and $N_2O$ and a second silicon oxynitride film produced from $SiH_4$ and $N_2O$ is applied. The first silicon oxynitride film and the second silicon oxynitride film are formed with a thickness of 50 nm and with a thickness of 100 nm, respectively. The blocking layer 102 is provided so as not to diffuse alkali metal included in the glass substrate into the semiconductor film formed in this upper layer. When quartz is used for the substrate, the blocking layer can be omitted.

A semiconductor material including mainly silicon is used for a semiconductor film 103 having an amorphous structure, which is formed on the blocking layer 102. Typically, an amorphous silicon film, an amorphous silicon germanium film, or the like is applied and formed with a thickness of 10 to 100 nm by a plasma CVD method, a low pressure CVD method, or a sputtering method. To obtain crystal having a good quality, it is necessary to minimize concentrations of impurities such as oxygen, nitrogen, and carbon, which are included in the semiconductor film 103 having the amorphous structure. Thus, not only a high-purity material gas but also an ultra-high vacuum capable CVD apparatus are desirably used.

Thereafter, a metal element having catalysis for promoting crystallization is added onto the surface of the semiconductor film 103 having the amorphous structure. The metal element having catalysis for promoting crystallization of the semiconductor film is Fe, Ni, Co, Ru, Rh, Pd, Os, Ir, Pt, Cu, Au, or the like, and one kind or plural kinds of elements selected from these elements can be used as the metal elements. Typically, nickel is used and a nickel acetate salt solution containing nickel at 1 to 10 ppm in weight conversion is applied by a spinner to form a catalytic contained layer 104. In this case, in order to improve conformability of the solution, surface processing of the semiconductor film 103 having the amorphous structure is performed. That is, an extremely thin oxide film is formed using an aqueous solution containing ozone and etched using a mixed solution of hydrofluoric acid and hydrogen peroxide solution to form a clean surface, and then processed again using an aqueous solution containing ozone to form an extremely thin oxide film. Since the surface of a semiconductor film such as silicon is fundamentally hydrophobic, when the oxide film is formed as described above, the nickel acetate salt solution can be uniformly applied.

Of course, a method of manufacturing the catalytic contained layer 104 is not limited to such a method, and it may be formed by a sputtering method, an evaporation method, or a plasma CVD method.

Next, heat treatment is performed at 500° C. for 1 hour to emit hydrogen included in the semiconductor film 103 having the amorphous structure. Then, heat treatment is performed for crystallization at 580° C. for 4 hours. Thus, a crystalline semiconductor film 105 as shown in FIG. 1B is formed.

Further, in order to increase a crystallization ratio (ratio of a crystal component to the entire volume of a film) and to repair a defect left in crystal grains, it is also effective to irradiate the crystalline semiconductor film 105 with laser light. Excimer laser light having a wavelength of 400 nm or less or the second harmonic or the third harmonic of YAG laser light is used as the laser light. In any case, pulse laser light having a repetition frequency of about 10 to 1000 Hz is used and condensed at 100 to 400 mJ/cm$^2$ bet an optical system, and thus laser processing to the crystalline semiconductor film 105 may be performed at an overlap ratio of 90 to 95%.

Thus, the metal element (here, nickel) is left in the thus obtained crystalline semiconductor film 105. Although the distribution of the metal element is not uniform in the film, the metal element is left at an average concentration which exceeds $1\times10^{19}/cm^3$. Of course, even in such a state, various semiconductor elements including a TFT can be formed. However, more preferably, it is desirable that the metal element be removed by gettering.

FIG. 1B shows a step of adding a noble gas element or this element and a one conductivity type impurity element to the crystalline semiconductor film by an ion dope method in order to form gettering sites 108. A silicon oxide film 106 for masking is formed with a thickness of 100 to 200 nm on a portion of the surface of the crystalline semiconductor film 105, and the noble gas element or this element and the one conductivity type impurity element are added to a region in which openings 107 are provided and the crystalline semiconductor film is exposed. The concentration of the element in the crystalline semiconductor film is set to be $1\times10^{19}$ to $1\times10^{21}/cm^3$.

One kind or plural kinds of elements selected from the group, consisting of He, Ne, Ar, Kr, and Xe are used as the noble gas element. The present invention is characterized in that these inert gases are used as ion sources in order to form the gettering sites and implanted to the semiconductor film by an ion dope method or an ion implantation method. The implantation of ions of these inert eases has two meanings. One is to form dangling bonds by the implantation to cause distortion in the semiconductor film, and the other is to implant the ions between lattices of the semiconductor film to cause distortion therein. The implantation of ions by the inert gases can simultaneously satisfy both the meanings. In particular, when an element such as Ar, Kr, or Xe, which has a larger atomic radius than silicon is used, the latter is remarkably obtained.

When heat treatment is performed for gettering in a nitrogen atmosphere at 450 to 800° C. for 1 to 24 hours, for example, at 550° C. for 14 hours, the metal element can be segregated in the gettering sites 108.

Thereafter, when the gettering sites are removed by etching, a crystalline semiconductor film 109 in which the concentration of the metal element is reduced is obtained as shown in FIG. 1C. The thus formed crystalline semiconductor film 109 is made from an aggregation of rod shaped or needle shaped crystals and the respective crystals grow with a specific orientation in a macroscopic view.

Embodiment Mode 2

Figure 2A:
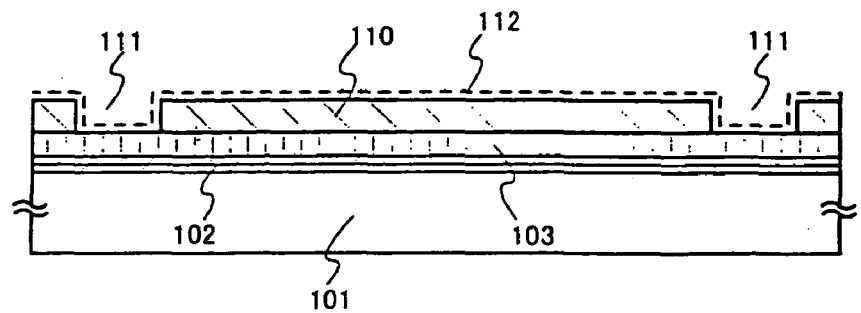
FIGS. 2A to 2D are explanatory views for a method of forming a crystalline semiconductor film according to the present invention.
Figure 2B:
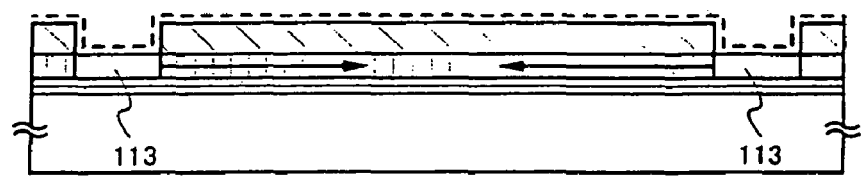
Figure 2C:
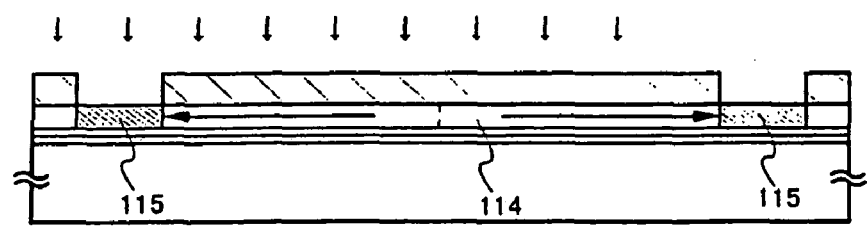

A method of selectively forming a layer containing an element for promoting crystallization of a semiconductor film will be described with reference to FIGS. 2A to 2D. In FIG. 2A, when a glass substrate is used as a substrate 101, a blocking layer 102 is provided. Also, a semiconductor film 103 having an amorphous structure is formed in the same manner as in Embodiment Mode 1.

Then, a silicon oxide film 110 having a thickness of 100 to 200 nm is formed on the semiconductor film 103 having the amorphous structure. A method of forming the silicon oxide film is not limited. For example, tetraethyl ortho silicate (TEOS) and $O_2$ are mixed and discharge is produced at a reaction pressure of 40 Pa, a substrate temperature of 300 to 400° C. and a high frequency (13.56 MHz) power density of 0.5 to 0.8 W/cm$^2$, to form the silicon oxide film.

Next, openings 111 are formed in the silicon oxide film 110 and a nickel acetate solution including nickel at 1 to 10 ppm in weight conversion is applied. Thus, a layer 112 containing a catalytic metal is formed and come into contact with the semiconductor film 103 only on the bottom portions of the openings 111.

The crystallization shown in FIG. 1B is performed by heat treatment at a heating temperature of 500 to 650° C. for 4 to 24 hours, for example, at 570° C. for 14 hours. In this case, silicides are formed in portions of the semiconductor film with which the metal element as a catalyst is in contact and the crystallization progresses from the silicides as nucleuses in a direction parallel to the surface of the substrate. The thus formed crystalline silicon film 114 is made from an aggregation of rod shaped or needle shaped crystals and the respective crystals grow with a specific orientation in a macroscopic view.

Figure 2D:
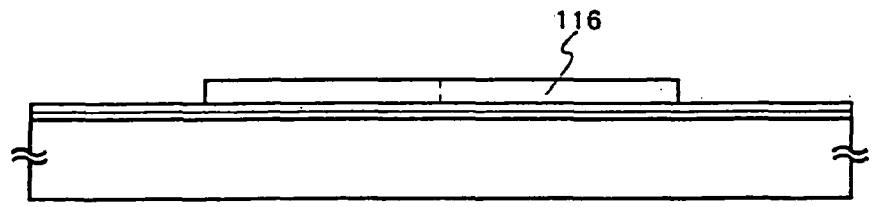

Next, a noble gas element or this element and a one conductivity type impurity element are added by an ion dope method using the openings 111 to form gettering sites 115. When heat treatment is performed for gettering in a nitrogen atmosphere at 450 to 800° C. for 1 to 24 hours, for example, at 550° C. for 14 hours, the metal element can be segregated in the gettering sites 115. Thereafter, when the gettering sites are removed by etching, a crystalline semiconductor film 116 in which the concentration of the metal element is reduced is obtained as shown in FIG. 2D.

Embodiment Mode 3

A channel forming region and impurity regions such as a source region and a drain region in a TFT can be formed using a semiconductor film formed using a metal element having catalysis. Here, a method of removing the metal element from a channel forming region using the impurity regions as gettering sites in TFT manufacturing steps will be explained.

Figure 3A:
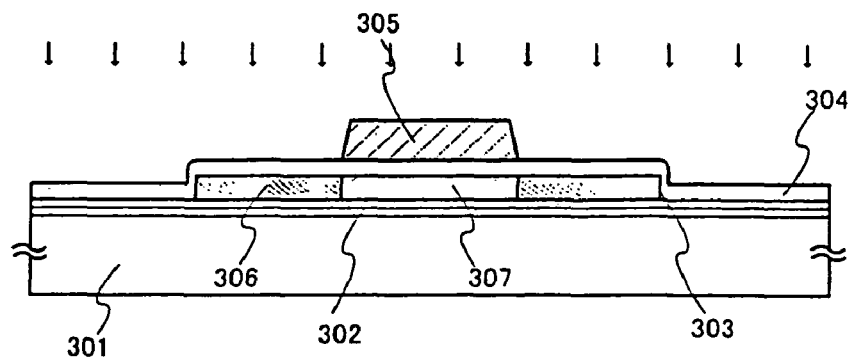
FIGS. 3A and 3B are explanatory views for a method of manufacturing a semiconductor device by a gettering method using a noble gas element.

In FIG. 3A, a substrate 301, a blocking layer 302, and a semiconductor film 303 are formed similarly to Embodiment Modes 1 or 2. An insulating film formed in the upper layer of the semiconductor film 303 is used as a gate insulating film of a TFT, and is made of silicon oxide or silicon oxynitride, with a thickness of 30 to 150 nm, typically, 80 nm. A gate electrode 305 is preferably made of a metal material such as tungsten, tantalum, titanium, or molybdenum or an alloy thereof.

In the case of an n-channel TFT, a donor, typically, phosphorus is added to an impurity regions 306. Also, in the case of a p-channel TFT, boron is added as an acceptor to the impurity regions 306. In any case, the impurity regions 306 can be formed by an ion dope method. In the case of adding phosphorus, $PH_3$ is used. In the case of adding boron, $B_2H_6$ is used. These are generally diluted with hydrogen and supplied. In order to use this impurity regions as effective gettering sites, a noble gas element is implanted simultaneously with, before, or after the addition of the donor or the acceptor by an ion dope method.

Figure 3B:
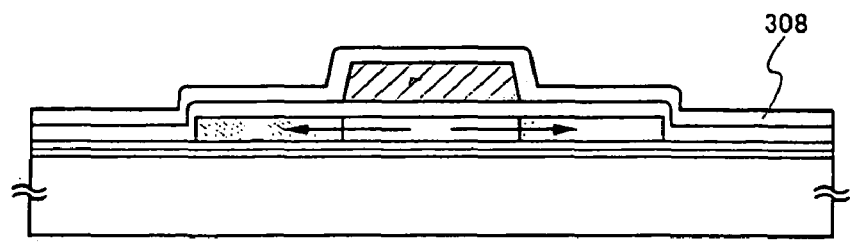

Thereafter, as shown in FIG. 3B, a passivation film 308 is made from a silicon nitride film or a silicon oxynitride film and heat treatment is performed in a nitrogen atmosphere at 450 to 800° C. for 1 to 24 hours, for example, at 550° C. for 14 hours. Thus, the impurity regions 306 become the gettering sites, and the metal element can be segregated from the channel forming region into the gettering sites. Therefore, the donor or the acceptor and the metal element are both present in the impurity regions.

Figure 4A:
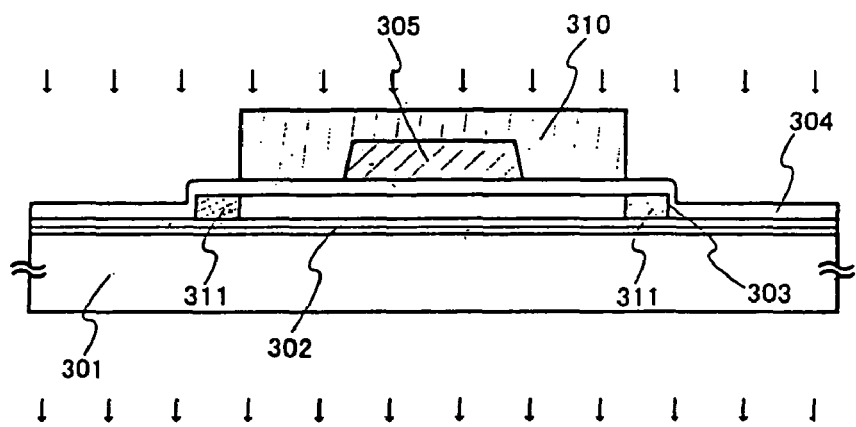
FIGS. 4A to 4C are explanatory views for a method of manufacturing the semiconductor device by the gettering method using the noble gas element.

Also, as shown in FIG. 4A, after the blocking layer 302, the semiconductor film 303, the insulating film 304, and the gate electrode 305 are formed on or over the substrate 301, a mask 310 is formed. Then, one kind or plural kinds of elements belonging to a group 18 of the periodic table are added to the end portions of the semiconductor film 303 using the mask 310 to form gettering sites 311.

Figure 4B:
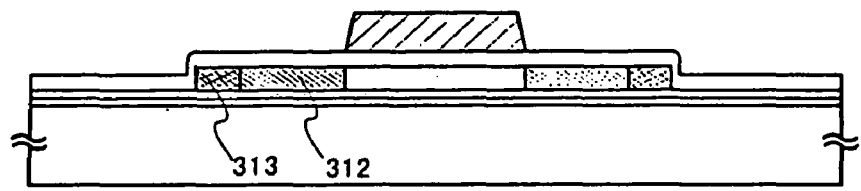
Figure 4C:
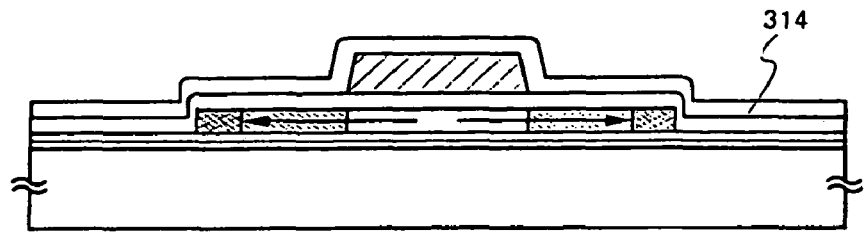

Thereafter, a donor or an acceptor is added to form impurity regions 312. Similarly, the donor or the acceptor is added to the gettering sites 311 and thus these are separately indicated as gettering sites 313. Then, as shown in FIG. 4C, a passivation film 314 is made from a silicon nitride film or a silicon oxynitride film and heat treatment is performed in a nitrogen atmosphere at 450 to 800° C. for 1 to 24 hours, for example, at 550° C. for 14 hours. Thus, the metal element can be segregated from the channel forming region into the gettering sites 313.

In a region of the semiconductor film to which the noble gas element is added, the crystalline structure is broken and the region becomes amorphous. An element belonging to the group 18 of the periodic table does not bond to silicon and is present between lattices. However, when the concentration of the element is high, the lattices are kept in a distorted state and thus it is difficult to recrystallize the region by later heat treatment. On the other hand, for the purpose of forming the gettering sites, an effect for segregating the metal element is further enhanced with increasing the distortion. The structures shown in FIGS. 4A to 4C correspond to a method of simultaneously satisfying both the matters and indicate an example in which the impurity regions for forming an element and the gettering sites are separately formed.

Embodiment Mode 4

Figure 5:
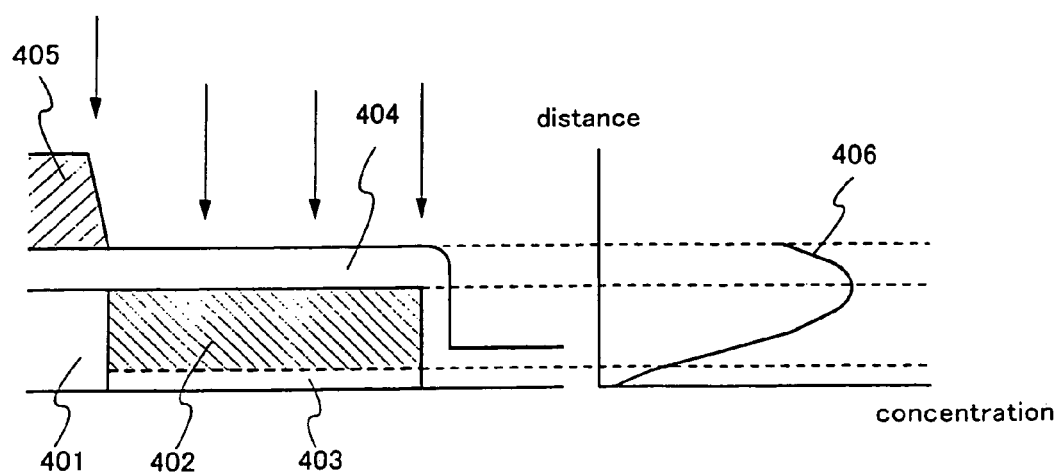
FIG. 5 is an explanatory view for a suitable concentration distribution for the noble gas element implanted by an ion dope method.

FIG. 5 is an explanatory view of an addition of a noble gas element introduced into a semiconductor film in order to produce lattice distortion or lattice defect therein. The gettering described in FIGS. 3A and 3B and FIGS. 4A to 4C indicates an example in which gettering sites are formed in a portion of an element forming region of a semiconductor film. In this case, it is considered that the gettering sites can be desirably recrystallized by heat treatment.

With respect to a semiconductor film including mainly silicon, a noble gas element having a high concentration often becomes a factor for hindering the recrystallization. To surely perform the recrystallization, it is necessary to focus attention on the concentration distribution of an element to be implanted, belonging to group 18 of the periodic table. In FIG. 5, structures of a semiconductor film 401, an insulating film 404, and a gate electrode 405 are similar to those in FIG. 3A. The element belonging to the group 18 is implanted into the semiconductor film 401 through the insulating film 404. Although the concentration distribution of the implanted element is dependent on an accelerating voltage, the concentration distribution as indicated in a graph inserted into FIG. 5, along a thickness direction from the insulating film 404 to the semiconductor film 401 is obtained.

In the semiconductor film 401, the concentration of the noble gas element becomes high in the insulating film 404 side and low in the opposite side. Whether or not it becomes amorphous is dependent on the concentration of the element to be implanted, belonging to group 18. When the concentration is low, a crystalline portion can be left. Although the boundary cannot be clearly identified, as shown in FIG. 5, a region 402 to which an element belonging to the group 18 is added and which became amorphous can be distinguished from a region 403 to which an element belonging to the group 18 is added but in which a crystalline portion is left.

If the region 403 in which the crystalline portion is left is present, it is easily recrystallized by heat treatment with gettering. That is, the region 403 in which the crystalline portion is left becomes a nucleus for crystal growth and thus the crystallization of the region 402 which became amorphous can be promoted. Such gettering sites can be easily realized by controlling an accelerating voltage in an ion dope method. Even if the gettering sites are doped with a donor or an acceptor, it can be similarly realized.

Of course, the structure indicated by this embodiment mode can be applied to the cases of forming the Bettering sites in Embodiment Modes 1 to 3.

Embodiment Mode 5

FIGS. 6A to 6D are explanatory views of another embodiment mode of the present invention and show a method of adding a metal element having catalysis onto the entire surface of an amorphous semiconductor film to crystallize it and then performing gettering.

In FIG. 6A, barium borosilicate glass, aluminoborosilicate glass, quartz, or the like can be used for a substrate 101. An inorganic insulating film is formed as a blocking layer 102 with a thickness of 10 to 200 nm on the surface of the substrate 101. One example of a preferable blocking layer is a silicon oxynitride film produced by a plasma CVD method and a laminate of a first silicon oxynitride film produced from $SiH_4$, NH$_3$, and N$_2$O and a second silicon oxynitride film produced from SiH$_4$ and N$_2$O is applied. The first silicon oxynitride film and the second silicon oxynitride film are formed with a thickness of 50 nm and with a thickness of 100 nm, respectively. The blocking layer 102 is provided so as not to diffuse alkali metal included in the glass substrate into the semiconductor film formed in the upper layer. When quartz is used for the substrate, the blocking layer can be omitted.

A semiconductor material including mainly silicon is used for a semiconductor film 103 having an amorphous structure, which is formed on the blocking layer 102. Typically, an amorphous silicon film, an amorphous silicon germanium film, or the like is applied and formed with a thickness of 10 to 100 nm by a plasma CVD method, a low pressure CVD method, or a sputtering method. To obtain good quality crystal, it is necessary to minimize concentrations of impurities such as oxygen, nitrogen, and carbon, which are included in the semiconductor film 103 having the amorphous structure. Thus, not only a high purity material gas but also an ultra-high vacuum capable CVD apparatus are desirably used.

Thereafter, a metal element having catalysis for promoting crystallization is added onto the surface of the semiconductor film 103 having the amorphous structure. The metal element having catalysis for promoting crystallization of the semiconductor film is iron (Fe), nickel (Ni), Cobalt (Co), ruthenium (Ru), rhodium (Rh), palladium (Pd), osmium (Os), iridium (Ir), platinum (Pt), copper (Cu), gold (Au), or the like and one kind or plural kinds of elements selected from these elements can be used as the metal elements. Typically, nickel is used and a nickel acetate solution including nickel at 1 to 10 ppm in weight conversion is applied by a spinner to form a catalytic contained layer 104. In this case, in order to improve conformability of the solution, surface processing of the semiconductor film 103 having the amorphous structure is performed. That is, an extreme thin oxide film is formed using an aqueous solution containing ozone and etched using a mixed solution of hydrofluoric acid and hydrogen peroxide solution to form a clean surface, and then processed again using an aqueous solution containing ozone to form an extreme thin oxide film. Since the surface of a film of a semiconductor such as silicon is fundamentally hydrophobic, when the oxide film is formed as described above, the nickel acetate solution can be uniformly applied.

Of course, a method of forming the catalytic contained layer 104 is not limited to such a method, and it may be formed by a sputtering method, an evaporation method, or plasma processing.

Next, first intense light irradiation is performed for crystallization. Thus, a crystalline semiconductor film 105 shown in FIG. 6B is formed. Any one of infrared light, visible light, and ultraviolet light or a combination thereof can be used as the first intense light. Light emitted from, typically, a halogen lamp, a metal halide lamp, a xenon arc lamp, a carbon arc lamp, a high pressure sodium lamp, or a high pressure mercury lamp is used (FIG. 6B). Note that, if necessary, heat treatment such that hydrogen contained in the semiconductor film 103 having the amorphous structure is emitted may be performed before the first intense light irradiation.

Then, in order to increase a crystallization ratio (ratio of crystal component to the entire volume of a film) and to repair a defect left in crystal grains, it is also effective to irradiate the crystalline semiconductor film 105 with laser light. Excimer laser light having a wavelength of 400 nm or less or the second harmonic or the third harmonic of YAG laser light is used as the laser light. In any case, pulse laser light having a repetition frequency of about 10 to 1000 Hz is used and condensed at 100 to 400 mJ/cm$^2$ by an optical system, and thus laser processing to the crystalline semiconductor film 105 may be performed at an overlap ratio of 90 to 95%.

The metal element (here, nickel) is left in the crystalline semiconductor film 105 thus obtained. Although the distribution of the metal element is not uniform in the film, the metal element is left at an average concentration which exceeds 1×10$^{19}$/cm$^3$. Of course, even in such a state, various semiconductor elements including a TFT can be formed. However, more preferably, the metal element is removed by gettering.

Further, second intense light irradiation is performed for the crystalline semiconductor film 105 to disperse the metal element (here, nickel) into the film. Any one of infrared light, visible light, and ultraviolet light or a combination thereof can be used as the second intense light. Light emitted from, typically, a halogen lamp, a metal halide lamp, a xenon arc lamp, a carbon arc lamp, a high pressure sodium lamp, or a high pressure mercury lamp is used.

FIG. 7A shows a step of adding a noble gas element or this element and a one conductivity type impurity element to a portion of the crystalline semiconductor film 105 by an ion dope method in order to form impurity regions (hereinafter referred to as gettering sites) 108. In the case of the ion dope method, an Ar gas, a mixed gas of phosphine (PH$_3$) diluted with hydrogen and an Ar gas, a mixed gas of diborane (B$_2$H$_6$) diluted with hydrogen and an Ar gas, phosphine (PH$_3$) diluted with argon, or diborane (B$_2$H$_6$) diluted with argon can be used as a raw gas.

A silicon oxynitride film 106 for masking is formed with a thickness of 100 to 200 nm on the surface of the crystalline semiconductor film 105 by using a mask 107 made of a resist and a noble gas element or this element and a one conductivity type impurity element are added to a region in which openings are provided and the crystalline semiconductor film is exposed. The concentration of the element in the crystalline semiconductor film is set to be 1×10$^{19}$ to 1×10$^{21}$/cm$^3$.

One kind or plural kinds of elements selected from the group consisting of helium (He), neon (Ne), argon (Ar), krypton (Kr), and xenon (Xe) are used as the noble gas element. The present invention is characterized in that these inert gases are used as ion sources in order to form the gettering sites and implanted to the semiconductor film by an ion dope method or an ion implantation method. The implantation of ions by these inert gases has two meanings. One is to form dangling bonds by the implantation to cause distortion in the semiconductor film and the other is to implant the ions between lattices of the semiconductor film to cause distortion therein. The implantation of ions by the inert gases can simultaneously satisfy both meanings. In particular, when an element such as argon (Ar), krypton (Kr), or xenon (Xe), which has a larger atomic radius than silicon, is used, the latter is satisfied remarkably. Also, when the noble gas element is implanted, not only lattice distortion but also dangling bonds are produced and thus such implantation provides the gettering action. Further, when phosphorus as the one conductivity type impurity element is implanted to the semiconductor film in addition to the noble gas element, gettering can be produced using Coulomb force of phosphorus. Furthermore, when hydrogen is implanted to the semiconductor film in addition to the noble gas element, gettering can be produced using the produced dangling bonds.

Next, after the mask 107 made of a resist is removed, a gettering step for segregating the metal element included in the semiconductor film into the gettering sites is performed (FIG. 7B).

As the gettering step, heat treatment is preferably performed in a nitrogen atmosphere at 450 to 800° C. for 1 to 24 hours, for example, at 550° C. for 14 hours. Intense light irradiation may be performed instead of the heat treatment.

Also, the intense light irradiation may be performed in addition to the heat treatment. Note that, when an RTA method with light emitted from a halogen lamp, a metal halide lamp, a xenon arc lamp, a carbon arc lamp, a high pressure sodium lamp, or a high pressure mercury lamp, as a heating means for gettering, is used, the intense light irradiation is desirably performed such that a heating temperature of the semiconductor film becomes 400° C. to 550° C. If the heating temperature is too high, the distortion in the semiconductor film is disappeared and an action for releasing nickel from nickel silicide and an action for capturing nickel are lost, and thus gettering efficiency is reduced.

Then, the silicon oxynitride film 106 for masking is used for patterning of the crystalline semiconductor film without changing it. The gettering sites are removed by patterning to form the crystalline semiconductor film in a predetermined shape and then the silicon oxynitride film 106 for masking is removed. Also, after the mask 106 is removed, heat treatment at 550° C. to 650° C. or intense light irradiation may be performed to mainly planarize the surface of the semiconductor film.

Thus, as shown in FIG. 7C, the crystalline semiconductor film 109 in which the concentration of the metal element is reduced is obtained. The crystalline semiconductor film 109 formed by the above present invention is made from an aggregation of rod shaped or needle shaped crystals and the respective crystals grow with a specific orientation in a macroscopic view. The crystalline semiconductor film 109 is used as the active layer of a TFT and thus a TFT as shown in FIG. 7D can be completed.

When a minute semiconductor film is formed, only the noble gas element is desirably added to perform gettering in this embodiment mode. In the case where only the noble gas element is added to perform gettering, even if a minute semiconductor film is formed. TFT characteristic is not influenced, as compared with the case where gettering is produced using phosphorus. Thus, such a case is effective.

Embodiment Mode 6

A method of selectively segrigating an element for promoting crystallization of a semiconductor film will be described. When a glass substrate is used as a substrate, a blocking layer is provided. A semiconductor film having an amorphous structure is also formed similarly to Embodiment mode 1.

Then, a silicon oxide film having a thickness of 100 to 200 nm is formed on the semiconductor film having the amorphous structure. A method of forming the silicon oxide film is not limited. For example, TEOS and $O_2$ are mixed and discharge is produced at a reaction pressure of 40 Pa, a substrate temperature of 300 to 400° C. and a high frequency (13.56 MHz) power density of 0.5 to 0.8 $W/cm^2$, to form the silicon oxide film.

Next, openings are formed in the silicon oxide film and a nickel acetate solution including nickel at 1 to 10 ppm in weight conversion is applied. Thus, a layer containing a catalytic metal is formed and come into contact with the semiconductor film only in the bottom portions of the openings.

Then, crystallization is performed by heat treatment at a heating temperature of 500 to 650° C. for 4 to 24 hours, for example, at 570° C. for 14 hours. In this case, silicides are formed in portions of the semiconductor film with which the metal element as a catalyst is in contact and the crystallization progresses from the silicides as nucleuses in a direction parallel to the surface of the substrate. The thus formed crystalline silicon film is made from an aggregation of rod shaped or needle shaped crystals and the respective crystals grow with a specific orientation in a macroscopic view.

Next, a noble gas element or this element and a one conductivity type impurity element are added by an ion dope method using the openings to form gettering sites. When heat treatment is performed for gettering in a nitrogen atmosphere at 450 to 800° C. for 1 to 24 hours, for example, at 550° C. for 14 hours, the metal element can be segregated in the gettering sites 115. Intense light irradiation may be performed instead of the heat treatment. Also, the intense light irradiation may be performed in addition to the heat treatment. Note that, when a RTA method with light emitted from a halogen lamp, a metal halide lamp, a xenon arc lamp, a carbon arc lamp, a high pressure sodium lamp, or a high pressure mercury lamp, as a heating means for gettering, is used, the intense light irradiation is desirably performed such that a heating temperature of the semiconductor film becomes 400° C. to 550° C. If the heating temperature is too high, the distortion in the semiconductor film is disappeared and an action for releasing nickel from nickel silicide and an action for capturing nickel are lost, and thus gettering efficiency is reduced.

Thereafter, when the gettering sites are removed by etching, a crystalline semiconductor film in which the concentration of the metal element is reduced is obtained.

Embodiment Mode 7

A channel forming region and impurity regions such as a source region and a drain region in a TFT can be formed using a semiconductor film formed using a metal element having catalysis. Here, a method of removing the metal element from a channel forming region 207 using the impurity regions as gettering sites in TFT manufacturing steps will be described.

In FIG. 8A, a substrate 201, a blocking layer 202, and a semiconductor film 203 are formed similarly to any one of Embodiment Modes 1 and 2. An insulating film formed in the upper layer of the semiconductor film 203 is used as a gate insulating film of a TFT and is made of silicon oxide or silicon oxynitride with a thickness of 30 to 150 nm, typically, 80 nm. A gate electrode 205 is preferably made of a metal material such as tungsten, tantalum, titanium, or molybdenum or an alloy thereof.

In the case of an n-channel TFT, a donor, typically, phosphorus is added to impurity regions 206. Also, in the case of a p-channel TFT, an acceptor, boron is added to the impurity regions 206. In any case, the impurity regions 206 can be formed by an ion dope method. In the case of adding phosphorus, $PH_3$ is used. In the case of adding boron, $B_2H_6$ is used. These are generally diluted with hydrogen and supplied. In order to use the impurity regions as effective gettering sites, a noble gas element is implanted simultaneously with, before, or after the addition of the donor or the acceptor by an ion dope method. The impurity regions 206 respectively become the source region and the drain region later.

In a region of the semiconductor film to which the noble gas element is added, the crystalline structure is broken and the region becomes amorphous, the noble gas element does not bond to silicon and is present between lattices. However, when the concentration of the element is high, the lattices are kept in a distorted state and thus it is difficult to recrystallize the region by later heat treatment. On the other hand, for the purpose of forming the gettering sites, an effect for segregating the metal element is further enhanced with increasing the distortion.

Thereafter, as shown in FIG. 8B, a passivation film 200 is made from a silicon nitride film or a silicon oxynitride film and heat treatment is performed in a nitrogen atmosphere at 450 to 800° C. for 1 to 24 hours, for example, at 550° C. for 14 hours. Thus, the impurity regions 206 become the gettering sites and the metal element can be segregated from the channel forming region 207 into the impurity regions. Therefore, the donor or the acceptor and the metal element coexist in the impurity regions. Note that, when the silicon oxynitride film is used as the passivation film, hydrogen included in the passivation film is diffused simultaneously with gettering and thus the semiconductor film can be hydrogenated. This step is a step of terminating dangling bonds in the semiconductor film by hydrogen included in the passivation film.

The example in which gettering and hydrogenation are simultaneously performed is described here. However, heat treatment for gettering and heat treatment for hydrogenation (heat treatment at, for example, 410° C.) may be performed in succession. Plasma hydrogenation (hydrogen excited by plasma is used) may be performed as another means for hydrogenation.

Then, intense light is irradiated to activate an impurity element for providing a one conductivity type, which is added to the impurity regions, and thus the resistance of the impurity regions is reduced. Since the passivation film is the silicon nitride film or the silicon oxynitride film, any one of YAG laser light (second harmonic or third harmonic) and intense light (light from lamp heating means) or a combination thereof is desirably used as the intense light. When the silicon oxide is used for the passivation film, any one of excimer laser light having a wavelength of 400 nm or less, YAG laser light (second harmonic or third harmonic), and intense light (light from a lamp heating means) and or a combination thereof can be used as the intense light. Note that activation may be made by heat treatment. However, since recrystallization by only heat treatment is difficult as described above, intense light irradiation or both heat treatment and intense light irradiation are desirably performed.

Then, an interlayer insulating film is formed, respective contact holes which reach the source region or the drain region are formed, and a conductive film is laminated. Thereafter, patterning is performed to form the source electrode and the drain electrode, and thus an n-channel TFT or a p-channel TFT is completed. A CMOS circuit can be formed by combining an n-channel TFT and a p-channel TFT.

Embodiment Mode 8

Here, an example in which the manufacturing step order after the step of forming the passivation film is different from Embodiment Mode 3 will be indicated.

First, the same state as in FIG. 8B, which is described in Embodiment Mode 3 is obtained. Gettering is performed after the formation of a passivation film. When heat treatment is performed in a nitrogen atmosphere at 450 to 800° C. for 1 to 24 hours, for example, at 550° C. for 14 hours, the impurity regions become the gettering sites and the metal element can be segregated from the channel forming region into the impurity regions. In the heat treatment for gettering, activation of an impurity element for providing a one conductivity type may be performed. Also, intense light irradiation may be performed instead of the heat treatment for gettering to simultaneously perform gettering and activation of an impurity element. Note that, when a RTA method with light emitted from a halogen lamp, a metal halide lamp, a xenon arc lamp, a carbon arc lamp, a high pressure sodium lamp, or a high pressure, mercury lamp, as a heating means for gettering, is used, the intense light irradiation is desirably performed such that a heating temperature of the semiconductor film becomes 400° C. to 550° C. If the heating temperature is too high, the distortion in the semiconductor film is disappeared and an action for releasing nickel from nickel silicide and an action for capturing nickel are lost, and thus gettering efficiency is reduced.

Then, heat treatment is performed for hydrogenation in a nitrogen atmosphere at 300 to 550° C. for 1 to 12 hours, for example, at 410° C. for 1 hour. This step is a step of terminating dangling bonds in the semiconductor film by hydrogen included in the passivation film.

Then, an interlayer insulating film is formed, respective contact holes which reach the source region or the drain region are formed, and a conductive film is laminated. Thereafter, patterning is performed to form the source electrode and the drain electrode, and thus an n-channel TFT or a p-channel TFT is completed. A CMOS circuit can be formed by combining an n-channel TFT and a p-channel TFT.

Embodiment Mode 9

Here, an example in which the manufacturing step order after the addition of a noble gas element and an impurity element for providing a one conductivity type is different from Embodiment Mode 3 will be shown in FIGS. 9A to 9C.

First, the same state as in FIG. 8A, which is described in Embodiment Mode 3 is obtained (FIG. 9A). As shown in FIG. 9A, a blocking layer 302, a semiconductor film 303, an insulating film 304, and a gate electrode 305 are formed on or over a substrate 301. Then, any one kind or plural kinds of noble gas elements are added to the end portions of the semiconductor film 303 using the gate electrode 305 as a mask to form gettering sites. Thereafter, a donor or an acceptor is added to the gettering sites to form impurity regions 306. The impurity regions 306 respectively become the source region and the drain region later.

Next, as shown in FIG. 9B, when heat treatment is performed in a nitrogen atmosphere at 450 to 800° C. for 1 to 24 hours, for example, at 550° C. for 14 hours, the impurity regions 306 become the gettering sites, and the metal element can be segregated from the channel forming region 307 into the gettering sites. In the heat treatment for the gettering, activation of an impurity element may be performed. Also, intense light irradiation may be performed instead of the heat treatment for the gettering to simultaneously produce gettering and activation. Note that, when an RTA method using light emitted from a halogen lamp, a metal halide lamp, a xenon arc lamp, a carbon arc lamp, a high pressure sodium lamp, or a high pressure mercury lamp, as a heating means for gettering, is used, the intense light irradiation is desirably performed such that a heating temperature of the semiconductor film becomes 400° C. to 550° C. If the heating temperature is too high, the distortion in the semiconductor film is disappeared, and an action for releasing nickel from nickel silicide and an action for capturing nickel are lost, and thus gettering efficiency is reduced.

Then, as shown in FIG. 9C, a passivation film 308 is made from a silicon nitride film or a silicon oxynitride film and heat treatment is performed for hydrogenation in a nitrogen atmosphere at 300 to 550° C. for 1 to 12 hours, for example, at 410° C. for 1 hour.

Then, an interlayer insulating film is formed, contact holes which reach the source region or the drain region are formed, and a conductive film is laminated. Thereafter, patterning is performed to form the source electrode and the drain electrode, and thus an n-channel TFT or a p-channel TFT is completed. A CMOS circuit can be formed by combining an n-channel TFT and a p-channel TFT.

Embodiment Mode 10

Here, an example in which the surface of a semiconductor film having a crystalline structure, which is obtained by crystallizing an amorphous semiconductor film by heat treatment or intense light irradiation, is etched in any one of Embodiment Modes 1 to 5 will be indicated.

For example, nickel silicide is removed by wet etching using hydrofluoric acid system etchant and then laser light irradiation is performed for anneal to the semiconductor film. Later steps are performed according to Embodiment Modes 1 to 5 and a noble gas element is preferably added to the semiconductor film having the crystalline structure to perform gettering.

A mixed solution of hydrofluoric acid and hydrogen peroxide solution. FPM (mixed solution of hydrofluoric acid, hydrogen peroxide solution, and pure water), or the like is used as the above hydrofluoric acid system etchant.

Embodiment 1

In order to check the validity of the present invention, the following experiment is performed using argon as a noble gas element.

A crystalline semiconductor film crystallized by dehydrogenation processing at 500° C. for 1 hour and heat treatment at 550° C. for 4 hours after a solution including nickel acetate at 10 ppm is applied to an amorphous silicon film with a thickness of 50 nm, is used as a semiconductor film. The crystalline semiconductor film is patterned and then a silicon oxide film with a thickness of 90 nm is formed. A sample produced by implanting phosphorus into gettering sites by an ion dope method, a sample produced by implanting argon thereinto after the implantation of phosphorus, and a sample produced by implanting only argon thereinto are prepared and evaluated by comparison. At this time, with respect to an implantation condition of phosphorus, $PH_3$ at 5% diluted with hydrogen is used, an accelerating voltage is set to be 80 keV, and a dose is set to be $1.5\times10^{15}/cm^2$. A time required for implantation is about 8 minutes. Thus, phosphorus having an average concentration of $2\times10^{20}/cm^3$ can be implanted into the crystalline semiconductor film. On the other hand, argon is implanted at an accelerating voltage of 90 keV and a dose of $2\times10^{15}$ or $4\times10^{15}/cm^2$. Argon having a purity of 99.9999% or larger is used. It is sufficient that a time required for implantation is 1 to 2 minutes. These conditions are listed in Table 1.

Table 1

Figure 11:
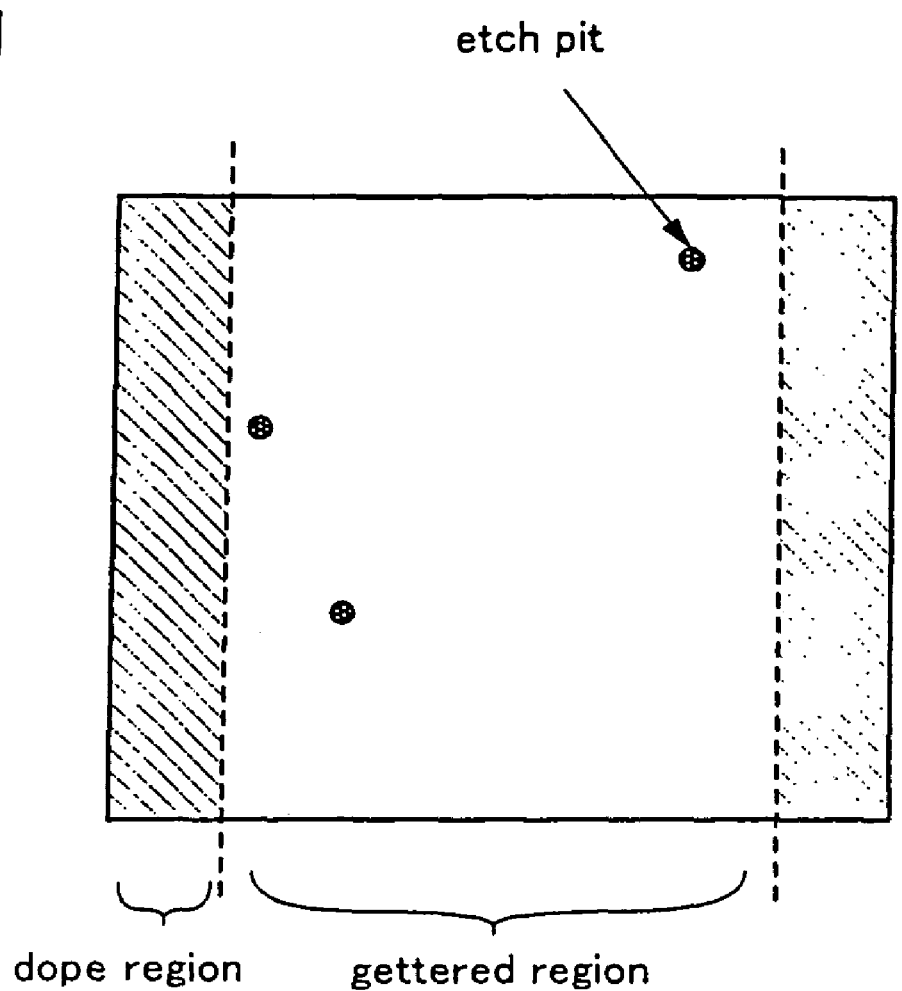
FIG. 11 is a simple view indicating the etch pit density observed by the FPM processing after the gettering.

Gettering is performed by heat treatment in a nitrogen atmosphere at 550° C. for 4 hours. After the gettering, the silicon oxide film is removed and then processed with FPM. A gettering effect is checked based on the number of etch pits in a gettering region to be gettered of the crystalline semiconductor film. That is, most of the added nickel is left as nickel silicide in the crystalline semiconductor film, and it is known that the nickel silicide is etched with FPM (mixed solution of hydrofluoric acid, hydrogen peroxide solution, and pure water). Therefore, the gettering region to be gettered is processed with the FPM and it is examined whether an etch pit is present or not, and thus the gettering effect can be checked. In this case, the smaller the number of etch pits is, the higher the gettering effect is. FIG. 11 is a simple view of a sample in which an etch pit is produced. Note that, in FIG. 11, a dope region indicates a region to which argon or phosphorus is added. The number of etch pits present in the gettered region (gettering region to be gettered) is counted while observing it using an optical microscope to obtain an etch pit density.

Figure 10:
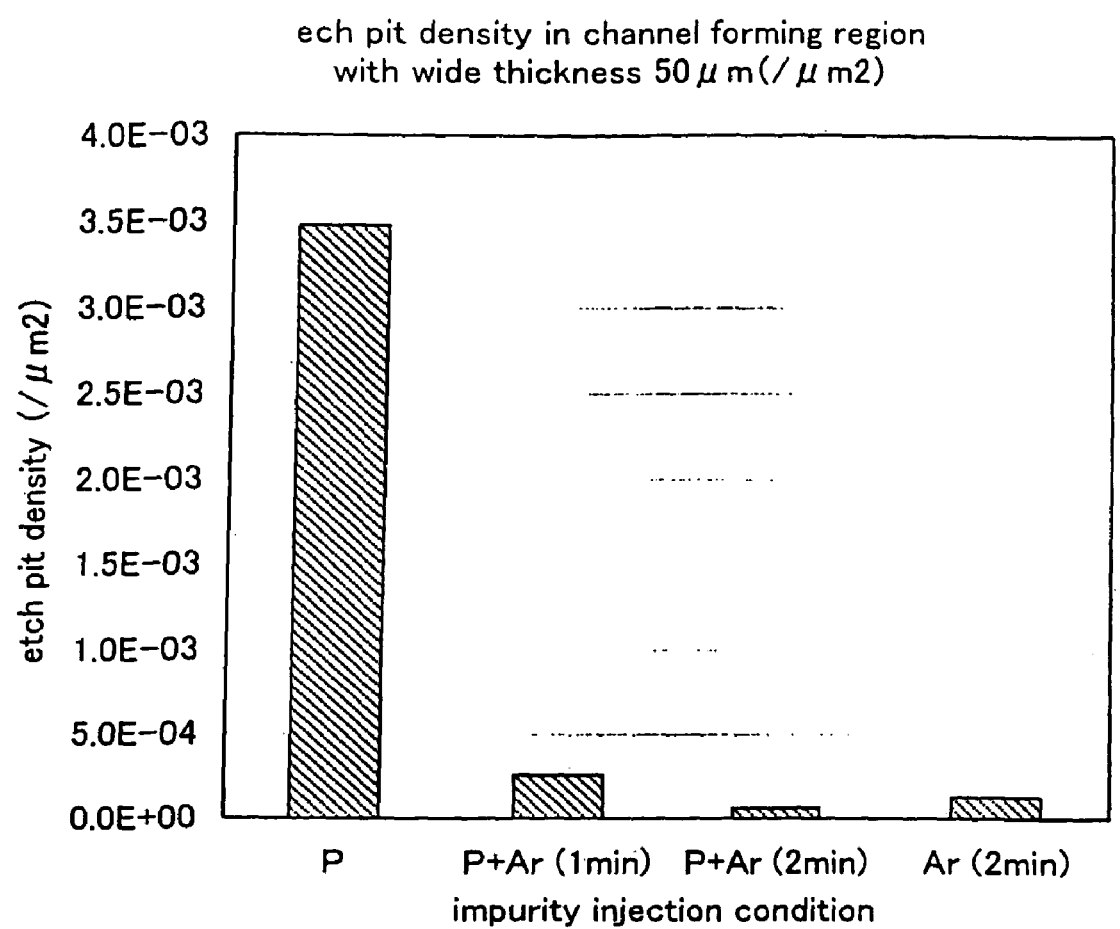
FIG. 10 is a graph indicating an etch pit density observed by FPM processing after the gettering.

FIG. 10 shows its result. In FIG. 10, a sample indicated by P is a sample to which only phosphorus is added. With respect to a phosphorus implantation condition of this sample, $PH_3$ at 5% diluted with hydrogen is used, an accelerating voltage is set to be 80 keV, and a dose is set to be $1.5\times10^{15}/cm^2$. Also, in FIG. 10, a sample indicated by P+Ar (1 min) is a sample to which phosphorus and argon are added. With respect to a phosphorus implantation condition of this sample, $PH_3$ at 5% diluted with hydrogen is used, an accelerating voltage is set to be 80 keV, and a dose is set to be $1.5\times10^{15}/cm^2$. With respect to an argon implantation condition, an accelerating voltage is set to be 90 keV, a dose is set to be $2\times10^{15}/cm^2$, and a time required for argon implantation is set to be 1 minute. Further, in FIG. 10, a sample indicated by P+Ar (2 min) is a sample to which phosphorus and argon are added. With respect to a phosphorus implantation condition of this sample, $PH_3$ at 5% diluted with hydrogen is used, an accelerating voltage is set to be 80 keV, and a dose is set to be $1.5\times10^{15}/cm^2$. With respect to an argon implantation condition, an accelerating voltage is set to be 90 keV, a dose is set to be $4\times10^{15}/cm^2$, and a time required for argon implantation is set to be 2 minutes. Furthermore, in FIG. 10, a sample indicated by Ar is a sample to which only argon is added. With respect to an argon implantation condition of this sample, an accelerating voltage is set to be 90 keV and a dose is set to be $2\times10^{15}/cm^2$.

From the result of the experiment shown in FIG. 10, it is apparent that, although the sample to which only phosphorus is added has an etch pit density of $3.5\times10^{-3}/ìm^2$, the sample in which argon is added to and gettering is performed has the number of etch pits (etch pit density) of $5\times10^{-4}/ìm^2$ or smaller, and thus the number of etch pits is decreased to an extreme. This result indicates that the gettering effect is improved to an extreme by argon implantation. Therefore, it is indicated that gettering using non metal elements (one kind or plural kinds of elements selected from the group consisting of B, Si, P, As, He, Ne, Ar, Kr, and Xe) according to the present invention is extremely effective.

Embodiment 2

In this embodiment, an example in which argon is added to, gettering is performed and then laser light irradiation is performed will be indicated.

First, a sample is produced as in Embodiment 1. A crystalline semiconductor film crystallized by dehydrogenation processing at 500° C. for 1 hour and heat treatment at 550° C. for 4 hours after a solution including nickel acetate at 10 ppm is applied to an amorphous silicon film with a thickness of 50 nm, is used as a semiconductor film. The crystalline semiconductor film is patterned and then a silicon oxide film with a thickness of 90 nm is formed. Next, by passing the silicon oxide film with a thickness of 90 nm, argon is implanted to the crystalline semiconductor film after phosphorus is implanted. At this time, with respect to an implantation condition of phosphorus, $PH_3$ at 5% diluted with hydrogen is used, an accelerating voltage is set to be 80 keV, and a dose is set to be $1.5\times10^{15}/cm^2$. A time required for implantation is about 8 minutes. Thus, phosphorus having an average concentration of $2\times10^{20}/cm^3$ can be implanted into the crystalline semiconductor film. On the other hand, argon is implanted at an accelerating voltage of 90 keV and a dose of $2\times10^{15}$ or $4\times10^{15}/cm^2$. Then, heat treatment is performed for gettering in a nitrogen atmosphere at 550° C. for 4 hours.

Figure 12:
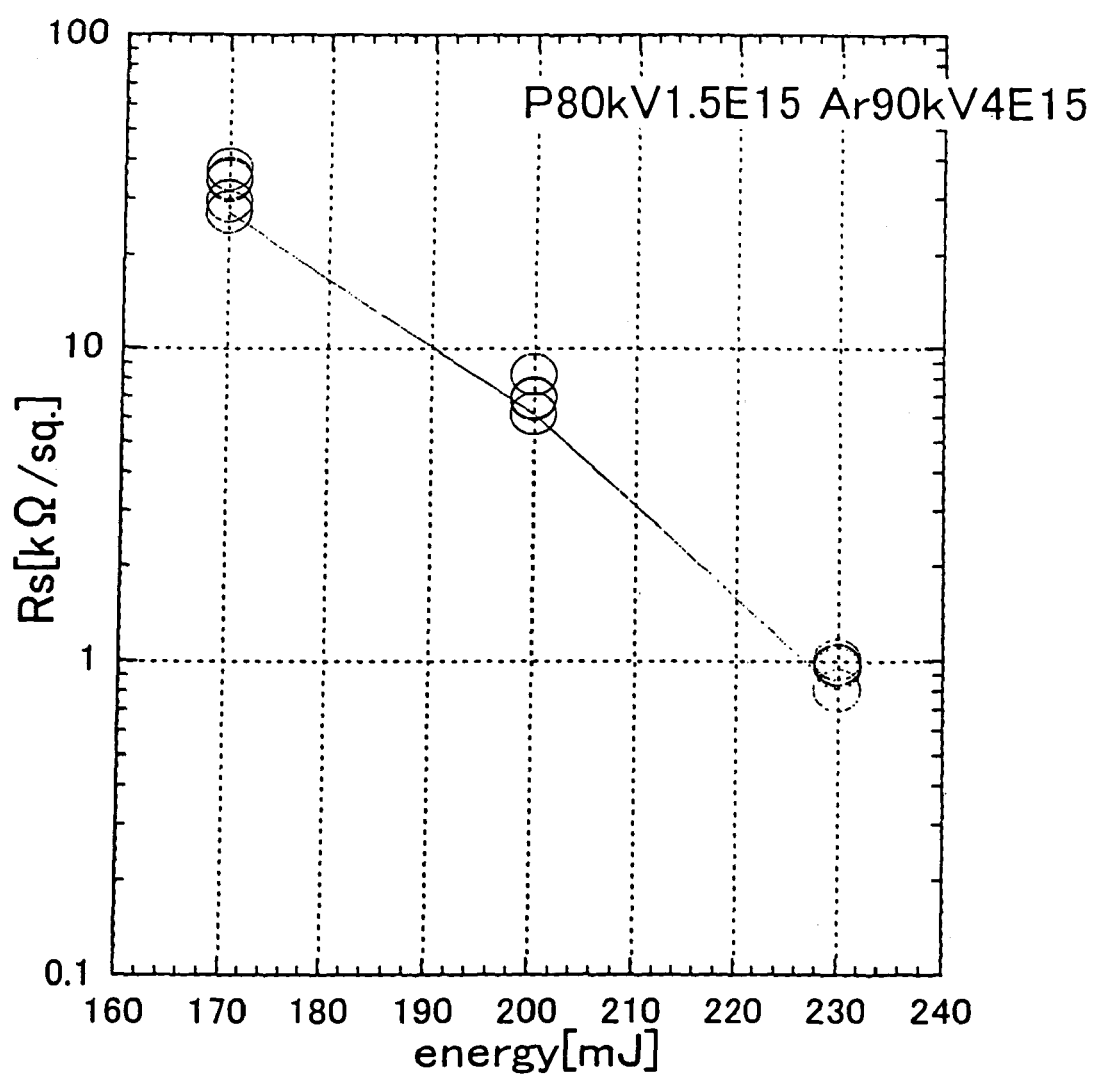
FIG. 12 is a graph indicating resistance values in the case where laser processing is performed after gettering.

Then, a laser energy condition is changed, and excimer laser light is irradiated. The result of the experiment after the subsequent sheet resistance measurement is shown in FIG. 12. As shown in FIG. 12, a sheet resistance value can be reduced to such a level that no problem is caused in a device characteristic by the laser light irradiation.

Note that, in this embodiment, laser light from a pulse oscillation type excimer laser is used. However, the present invention is not particularly limited to such a laser, and a continuous light emission type excimer laser, a YAG laser, or a $YVO_4$ laser may be used. A rapid thermal anneal method (RTA method) may be applied instead of a laser anneal method.

Note that this embodiment can be combined with any one of Embodiment Modes 1 to 10.

Embodiment 3

Figure 13A:
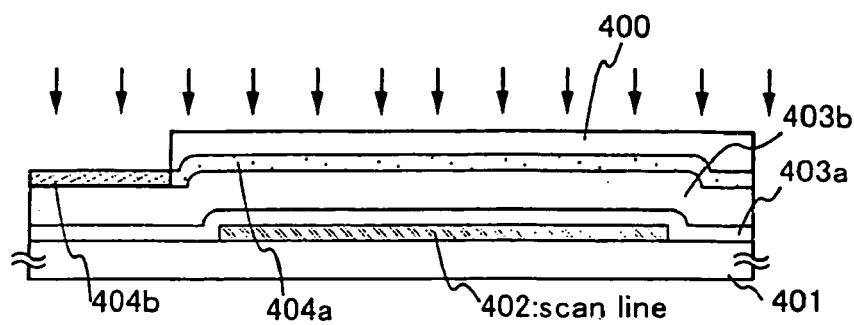

In this embodiment, an example in which the present invention is applied to a double gate TFT and an active matrix substrate using the double gate TFT as a TFT of a pixel portion is manufactured is shown in FIGS. 13A to 13C2.

First, a conductive film is formed on a substrate 401 having an insulating surface and patterned to form a scan line 402. The scan line 402 also severs as a light shielding layer for protecting an active layer formed later from light. Here, a quartz substrate is used as the substrate 401. Also, a laminate structure of a polysilicon film (50 nm in a film thickness) and a tungsten silicide (W—Si) film (100 nm in a film thickness) is used as the scan line 402. The polysilicon film is to prevent a contamination from the tungsten silicide to the substrate.

Then, insulating films 403a and, 403b covering the scan line 402 are formed with a film thickness of 100 to 1000 nm (typically 300 to 500 nm). Here, a silicon oxide film having a film thickness of 100 nm and a silicon oxide film having a film thickness of 280 nm using a CVD method and an LPCVD method, respectively, are laminated.

Then, an amorphous semiconductor film is formed with a film thickness of 10 to 100 nm. Here, the amorphous silicon film is formed with a film thickness of 69 nm by an LPCVD method. Then, the amorphous silicon film is crystallized using the technique for crystallizing this amorphous semiconductor film described in Japanese Patent Application Laid-open No. Hei 8-78329. According to the described technique, a metal element for promoting crystallization is selectively added to an amorphous silicon film, and heat treatment is performed to form such a crystalline silicon film in which the crystallization is expanded from an added region as a starting point. Here, nickel is used as the element for promoting crystallization. Also, after heat treatment for dehydrogenation (at 450° C., for 1 hour), heat treatment for crystallization (at 600° C., for 12 hours) is performed.

Then, a gettering site 404b for gettering Ni from a region as the active layer of a TFT is formed. The region as the active layer of the TFT is covered with a mask (silicon oxynitride film) 400 and a noble gas element, here, argon (Ar) is added to a portion of the crystalline silicon film (FIG. 13A). Note that the mask 400 is also used in the case of patterning the crystalline silicon film later. Further, when only the noble gas element is added as this embodiment, since the influence on an electrical characteristic and the like of a TFT is small as compared with the case of adding phosphorus, the region as the active layer of the TFT can be formed into a minute size. Thus, a finer design of a TFT is possible.

Further, the noble gas element may be added in a state in which the resist mask used at the formation of the mask 400 is left.

Further, one kind or plural kinds of elements selected from the group consisting of an element belonging to the group 15 of the periodic table, an element belonging to the group 13 thereof, silicon, and hydrogen may be added to the portion of the crystalline silicon film in addition to the noble gas element.

Figure 13B:
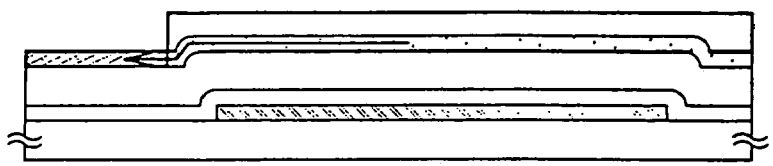

Then, heat treatment for gettering Ni from the region as the active layer of the TFT (in a nitrogen atmosphere at 550° C., for 4 hours) is performed (FIG. 13B). By this heat treatment, the metal (Ni) included in the crystalline silicon film is moved from the region as the active layer of the TFT in the direction of an arrow in FIG. 13B and captured in the gettering site (region to which the noble gas element is added). Thus, the metal (Ni) is removed from the crystalline silicon film except for the gettering site, or reduced.

Then, after the mask is removed and patterning is performed to remove an unnecessary portion of the crystalline silicon film, thereby forming a semiconductor film 404 (FIG. 13C1). Note that a top surface view of a pixel after the formation of the semiconductor film 404 is shown in FIG. 13C2. In FIG. 13C2, a cross sectional view obtained by cutting along a dotted line A-A' corresponds to FIG. 13C1.

Figure 14A:
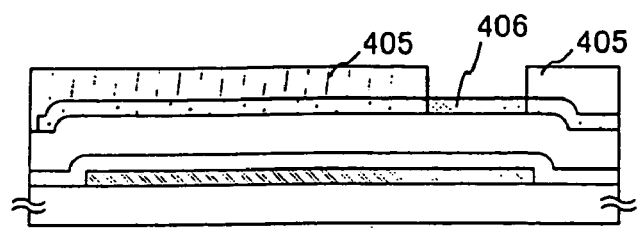

Then, in order to form a retaining capacitor, a mask 405 is formed and a portion of the semiconductor film (a region for the retaining capacitor) 406 is doped with phosphorus (FIG. 14A).

Figure 14B:
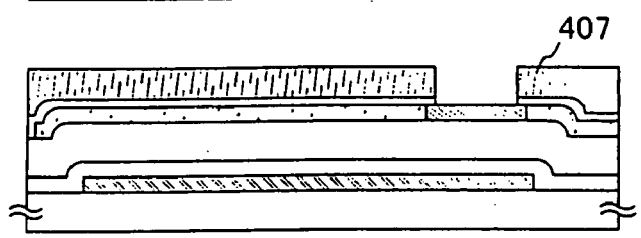

Then, after the mask 405 is removed and an insulating film covering the semiconductor film is formed, a mask 407 is formed and an insulating film on the region 406 for the retaining capacitor is removed (FIG. 14B).

Then, the mask 407 is removed and thermal oxidation is performed to form an insulating film (gate insulating film) 408a. A final film thickness of the gate insulating film becomes 80 nm by this thermal oxidation. Note that an insulating film 408b thinner than in other region of the insulating film is formed on the region for the retaining capacitor (FIG. 14C1). A top surface view of a pixel at this time is shown in FIG. 14C2. In FIG. 14C2, a cross sectional view obtained by cutting along a dotted line B-B' corresponds to FIG. 14C1. Also, a region indicated by chain lines in FIGS. 14C2 is a portion in which the thin insulating film 408b is formed.

Then, a channel dope step of entirely or selectively adding a p-type or an n-type impurity element at a low concentration to a region as the channel region of the TFT is performed. This channel dope step is a step for controlling a TFT threshold value voltage. Note that boron is added by an ion dope method using plasma excitation without mass separation of diborane ($B_2H_6$). Of course, an ion implantation method performing mass separation may also be used.

Then, a mask 409 is formed on or over the insulating films 408a, 403a, and 403b and a contact hole which reaches the scan line 402 is formed (FIG. 15A). After the formation of the contact hole, the mask is removed.

Then, a conductive film is formed and patterned to form a gate electrode 410 and a capacitor wiring 411 (FIG. 15B). Here, a laminate structure of a silicon film (150 nm in a film thickness) doped with phosphorus and tungsten silicide (150 nm in a film thickness) is used. Note that, a retaining capacitor is composed of the insulating film 408b as dielectric, the capacitor wiring 411, and a portion of the semiconductor film 406.

Then, phosphorus is added at a low concentration in a self alignment manner using the gate electrode 410 and the capacitor wiring 411 as masks (FIG. 15C1). A top surface view of a pixel at this time is shown in FIG. 15C2. In FIG. 15C2, a cross sectional view obtained by cutting along a dotted line C-C' corresponds to FIG. 15C1. A concentration of phosphorus in a region added at a low concentration of phosphorus is controlled to be $1\times10^{16}$ to $5\times10^{18}$ atoms/cm$^3$, typically, $3\times10^{17}$ to $3\times10^{18}$ atoms/cm$^3$.

Then, a mask 412 is formed and phosphorus is added thereto with the mask 412 at a high concentration to form high concentration impurity regions 413 respectively as a source region or a drain region (FIG. 16A). A concentration of phosphorus in this high concentration impurity regions is controlled to be $1\times10^{20}$ to $1\times10^{21}$ atoms/cm$^3$ (typically, $2\times10^{20}$ to $5\times10^{20}$ atoms/cm$^3$). Note that, in the semiconductor film 404, a region overlapped with the gate electrode 410 becomes a channel forming region 414, and regions covered with the mask 412 become low concentration impurity regions 415 and function as LDD regions. After the addition of the impurity element, the mask 412 is removed.

Then, although not shown here, in order to form a p-channel TFT used for a driver circuit formed on the same substrate as a pixel, a region as an n-channel TFT is covered with a mask, and boron is added to form the source region or the drain region.

Next, after the mask 412 is removed, a passivation film 416 which covers the gate electrode 410 and the capacitor wiring 411 is formed. Here, a silicon oxide film is formed with a film thickness of 70 nm. Then, a heat treatment step of activating an n-type or a p-type impurity element added to the semiconductor film at respective concentrations is performed. Here, heat treatment is performed at 850° C. for 30 minutes.

Then, an interlayer insulating film 417 made of an organic resin material is formed. Here, an acrylic resin film having a film thickness of 400 nm is used. Thereafter, contact holes which reach the semiconductor film are formed and an electrode 418 and a source wiring 419 are formed. In this embodiment, the electrode 418 and the source wiring 419 respectively are made from a laminate film having a three layers structure, in which a Ti film with a thickness of 100 nm, an aluminum film containing Ti with a thickness of 300 nm, and a Ti film with a thickness of 150 nm are formed in succession by a sputtering method (FIG. 16B1). Note that, in FIG. 16B2, a cross sectional view obtained by cutting along a dotted line D-D' corresponds to FIG. 16B1.

Then, after hydrogenation processing, an interlayer insulating film 420 made of acrylic is formed (FIG. 17A1). Then, a conductive film having a light shielding characteristic is formed with a film thickness of 100 nm on the interlayer insulating film 420 to form a light shielding layer 421. Thereafter, an interlayer insulating film 422 and a contact hole which reaches the electrode 418 are formed. A transparent conductive film (here, indium tin oxide (ITO) film) with a thickness of 100 nm is formed and then patterned to form pixel electrodes 423 and 424. In FIG. 17A2, a cross sectional view obtained by cutting along a dotted line E-E' corresponds to FIG. 17A1.

Thus, a pixel TFT made from an n-channel TFT is formed in the pixel portion while keeping an area (aperture ratio is 76.5%) of a display region (26 im×26 im in the pixel size) and a sufficient retaining capacitance (51.5 fF) can be obtained.

Note that this embodiment is one example, and the present invention is not limited to the steps of this embodiment. For example, an element selected from the group consisting of tantalum (Ta), titanium (Ti), molybdenum (Mo), tungsten (W), chromium (Cr), and silicon (Si) or an alloy of a combination of the elements (typically, an Mo—W alloy or an Mo—Ta alloy) can be used as the respective conductive film. Also, a silicon oxide film, a silicon nitride film, a silicon oxynitride film, or an organic resin material (polyimide, acrylic, polyamide, polyimideamide, BCB (benzocyclobutene), or the like) film can be used as the respective insulating films.

Thus, the pixel portion having the n-channel TFT and the retaining capacitor and the driver circuit (not shown) having a CMOS circuit composed of the n-channel TFT and the p-channel TFT can be formed on the same substrate. In this specification, such a substrate is called an active matrix substrate for convenience.

Next, a step of manufacturing a liquid crystal module using the obtained active matrix substrate will be described below.

An orientation film is formed on the active matrix substrate shown in FIG. 17A1 and rubbing processing is performed. Note that, in this embodiment, an organic resin film such as an acrylic resin film is patterned before the formation of the orientation film to form column-shaped spacers for keeping a substrate interval in predetermined positions. Instead of the column-shaped spacers, spherical spacers may be spread on the entire surface of the substrate.

Then, a counter substrate is prepared. A color filter in which colored layers and a light shielding layer are arranged corresponding to each pixel is provided in the counter substrate. Further, a light shielding layer is also provided in the driver circuit portion. A planarizing film is provided to cover this color filter and the light shielding layer. Thereafter, a counter electrode made from a transparent conductive film is formed in the pixel portion on the planarizing film, an orientation film is formed on the entire surface of the counter substrate, and rubbing processing is performed.

The active matrix substrate in which the pixel portion and the driver circuit are formed is adhered to the counter substrate by a sealing material. Fillers are mixed into the sealing materials. Two substrates are adhered to each other with keeping a constant interval by the fillers and the column-shaped spacers. Thereafter, a liquid crystal material is injected between both the substrates and complete sealing is performed by a sealing agent. A known liquid crystal material is preferably used as the liquid crystal material to be injected. Thus, the liquid crystal module is completed. If necessary, the active matrix substrate or the counter substrate is cut into a desired shape. Further, a polarizing plate and the like are suitably provide using a known technique. Then, an FPC is adhered using a known technique.

The liquid crystal module thus manufactured can be used as a display portion of various electronic devices.

Note that this embodiment can be combined with any one of Embodiment Modes 1 to 10.

Embodiment 4

In order to check the validity of the present invention, the following experiment is performed using argon (Ar) of non metal elements (one kind or plural kinds of elements selected from the group consisting of B, Si, P, As, He, Ne, Ar, Kr, and Xe).

An amorphous silicon film is formed with a film thickness of 400 nm on a substrate and a metal element (nickel) having catalytic for promoting crystallization is added onto the surface of the amorphous silicon film. A nickel acetate solution including nickel at 100 ppm in weight conversion is applied to the amorphous silicon by a spinner to form a catalytic contained layer. After heat treatment at 500° C. for 1 hour, heat treatment is further performed at 550° C. for 12 hours to form a silicon film having a crystalline structure.

An argon element is added to the thus obtained silicon film having the crystalline structure. Here, an ion doping method is used to add an argon element. An argon gas is used as a raw gas in condition that an accelerating voltage is 10 keV, a flow rate is 50 sccm, a current density is 1 iA/cm$^2$, and a dose is $2\times10^{15}$ atoms/cm$^2$. Note that the argon element is added only by a depth of about 0.05 ìm from the surface in this doping condition. Then, heat treatment (anneal) is performed for gettering at 550° C. for 4 hours.

Figure 18:
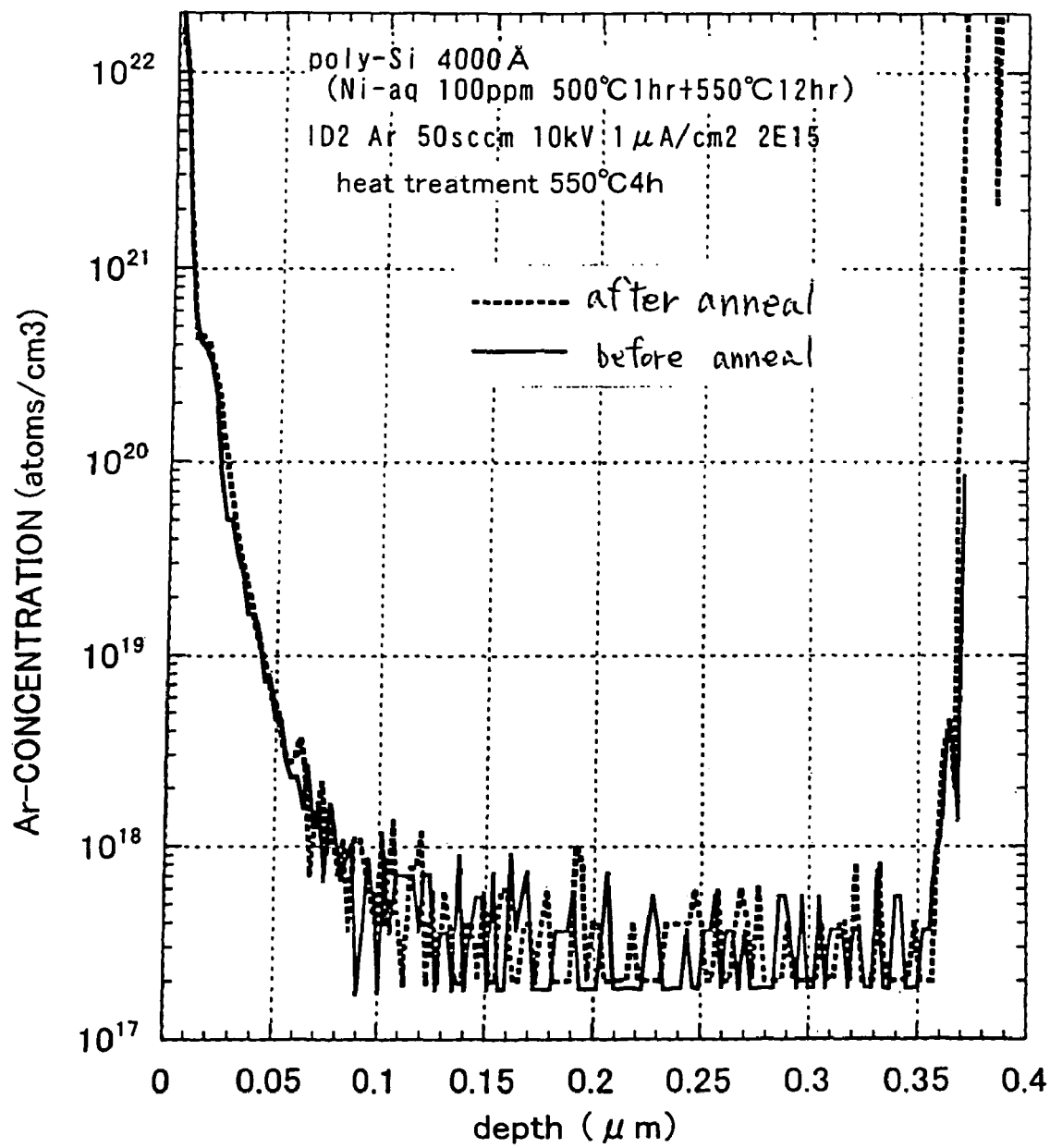
FIG. 18 is a graph indicating an argon concentration profile in a depth direction before and after anneal.
Figure 19:
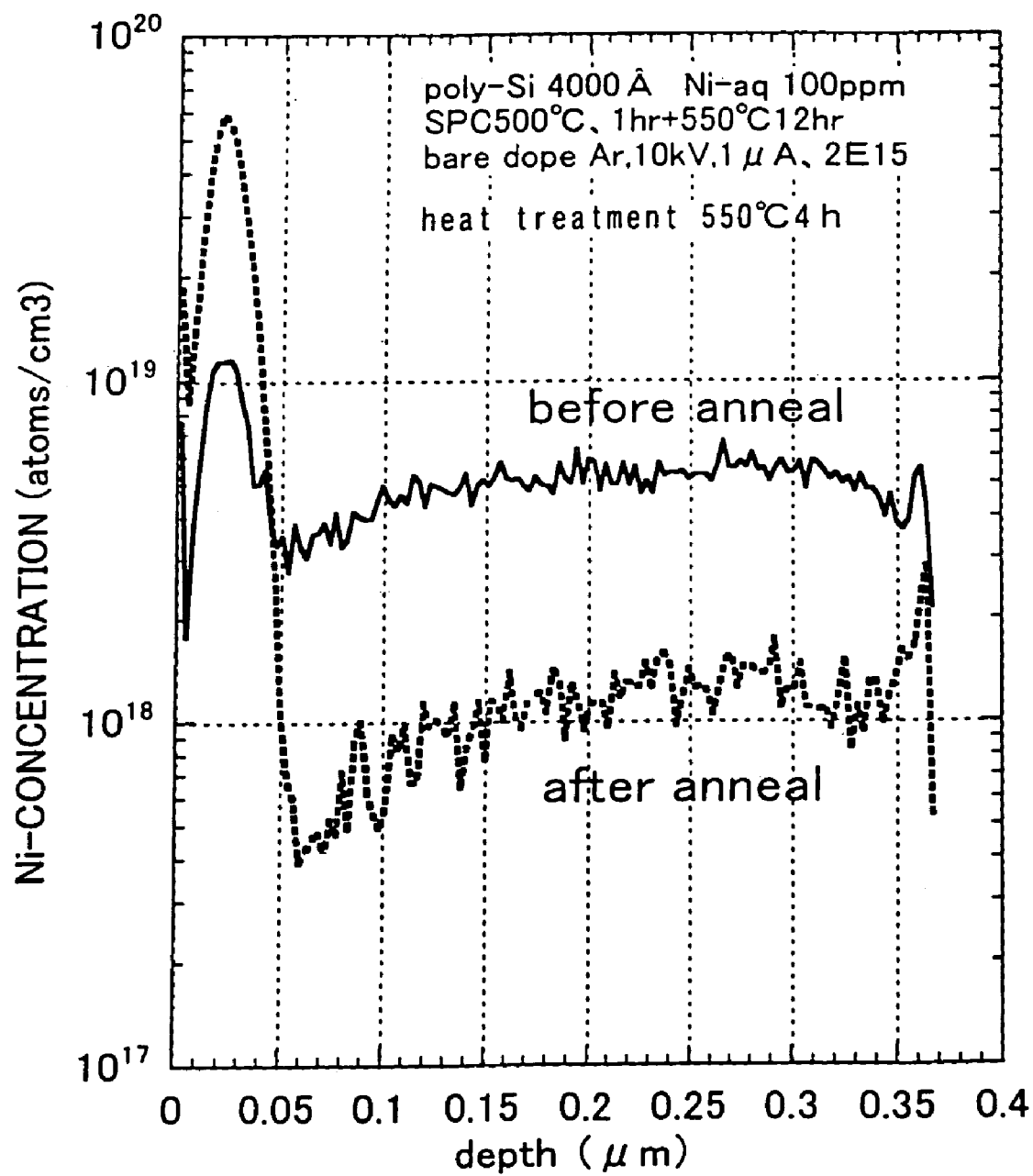
FIG. 19 is a graph indicating a nickel concentration profile in the depth direction before and after the anneal.

A concentration distribution (by SIMS measurement) of the argon element after addition and a concentration distribution (by SIMS measurement) of the nickel element after addition are shown in FIGS. 18 and 19, respectively, using a solid line indicating a concentration distribution before anneal. Note that, in FIGS. 18 and 19, abscissa indicates a depth and ordinate indicates a concentration. The concentration distribution (by SIMS measurement) of the argon element after anneal and the concentration distribution (by SIMS measurement) of the nickel element after anneal are shown in FIGS. 18 and 19, respectively, using a dotted line indicating a concentration distribution after anneal.

From experimental results shown in FIGS. 18 and 19, it is apparent that the concentration distribution of the argon element is not varied before and after anneal but the concentration distribution of the nickel element is varied before and after the anneal. In the region to which the argon element is added by a depth of about 0.05 ìm, a maximum nickel concentration after anneal becomes $6 \times 10^{19}$ atoms/cm$^3$. Also, in a region to which the argon element is not added, although the nickel concentration before anneal is about $5 \times 10^{18}$ atoms/cm$^3$, the nickel concentration after anneal is about $1 \times 10^{18}$ atoms/cm$^3$ and reduced to a minimum nickel concentration of $4 \times 10^{17}$ atoms/cm$^3$.

This result means that the region to which argon is added by a depth of about 0.05 ìm from the surface acts as gettering sites by anneal processing, the nickel element in the film is moved to the gettering sites, and thus the nickel element in the region to which argon is not added is reduced.

That is, the experimental result of this embodiment means that anneal is performed after the implantation of argon and thus the gettering effect is extremely high and it is indicated that gettering using non metal elements (one kind or plural kinds of elements selected from the group consisting of B, Si, P, As, He, Ne, Ar, Kr, and Xe) according to the present invention is extremely effective.

The concentration of the argon element is not varied. Thus, in the case where the gettering sites to which the argon element is added is used as a portion of the semiconductor film without processing and a TFT is manufactured using the semiconductor film, when heat treatment in a TFT manufacturing step after gettering is performed, the gettering effect can be continuously obtained. Also, since the gettering sites are heated by heat produced when the completed TFT is driven, the gettering effect can be continuously obtained.

Embodiment 5

Figure 20:
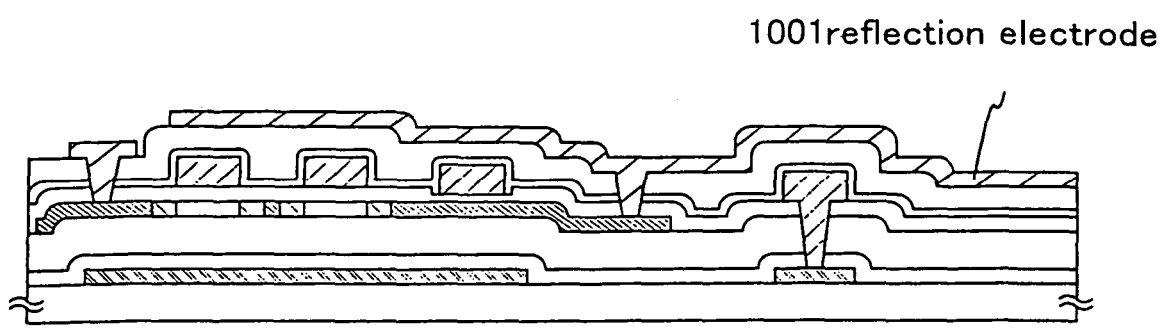
FIG. 20 is a cross sectional view of the pixel portion.

The example of a transmission type is described in Embodiment 4. In this embodiment, an example of a reflection type is shown in FIG. 20. In this embodiment, a reflection electrode is used as a pixel electrode connected with the drain region of a TFT in the pixel portion.

A pixel electrode is used as the electrode 418 in Embodiment 4 and a reflection electrode 1001 as a pixel electrode is formed. This reflection electrode is made from a material having superior reflecting property, such as a film including mainly Al or Ag or laminate film thereof. After the formation of the pixel electrode, preferably, a step such as a known sand blast method or a known etching method is added to produce unevenness of the surface, and thus a mirror reflection is prevented and reflected light is scattered to increase a whiteness degree.

Note that this embodiment can be combined with any one of Embodiment Modes 1 to 5.

Embodiment 6

A crystalline semiconductor film formed by implementing the present invention is used for an active layer of a TFT, and the TFT can be used for various modules (a liquid crystal display device, a light emitting type display device, an active matrix type EC display. DMD (digital micromirror device) or the like). That is, the present invention can be implemented in all the electronic devices in which those modules are incorporated into their display portions.

Figure 24A:
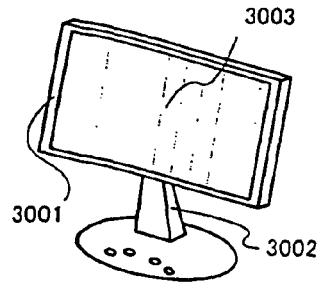
FIGS. 24A to 24G show examples of a semiconductor device.

FIG. 24A is an example of completing a television receiver by applying the present invention, and is composed of a housing 3001, a supporting stand 3002, a display portion 3003 and the like. A TFT substrate manufactured by the present invention is applied to the display portion 3003, and the television receiver can be completed by the present invention.

Figure 24B:
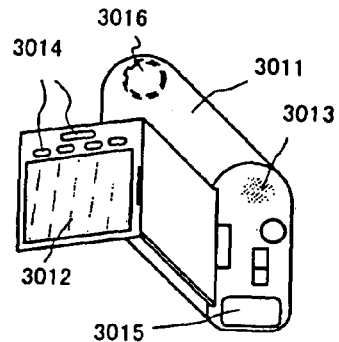

FIG. 24B is an example of completing a video camera by applying the present invention, and is composed of a main body 3011, a display portion 3012, an audio input portion 3013, operation switches 3014, a battery 3015, an image receiving portion 3016 and the like. The TFT substrate manufactured by the present invention is applied to the display portion 3012, and the video camera can be completed by the present invention.

Figure 24C:
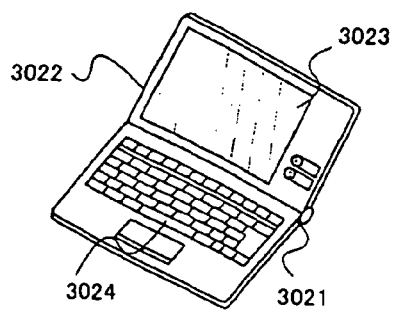

FIG. 24C is an example of completing a note type personal computer by applying the present invention, and is composed of a main body 3021, a housing 3022, a display portion 3023, a keyboard 3024 and the like. The TFT substrate manufactured by the present invention is applied to the display portion 3023, and the personal computer can be completed by the present invention.

Figure 24D:
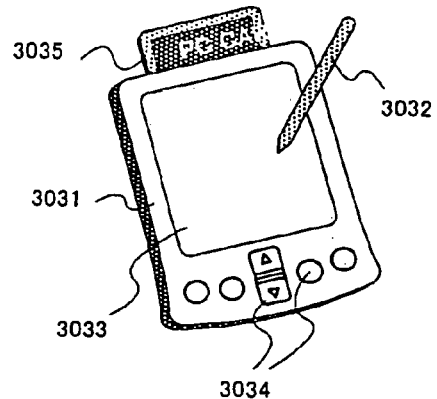

FIG. 24D is an example of completing a PDA (Personal Digital Assistant) by applying the present invention, and is composed of a main body 3031, a stylus 3032, a display portion 3033, operation buttons 3034, an external interface 3035 and the like. The TFT substrate manufactured by the present invention is applied to the display portion 3033, and the PDA can be completed by the present invention.

Figure 24E:
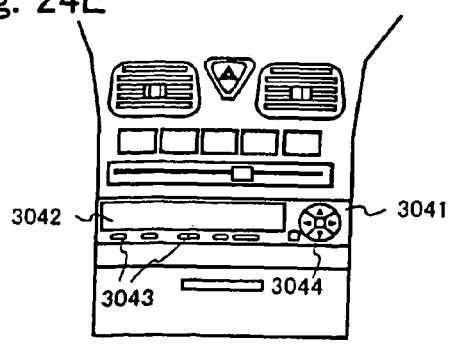

FIG. 24E is an example of completing a sound reproducing apparatus by applying the present invention. More specifically, it is an audio apparatus for automobile use, and is composed of a main body 3041, a display portion 3042, operation switches 3043 and 3044 and the like. The TFT substrate manufactured by the present invention is applied to the display portion 3042, and the audio apparatus can be completed by the present invention.

Figure 24G:
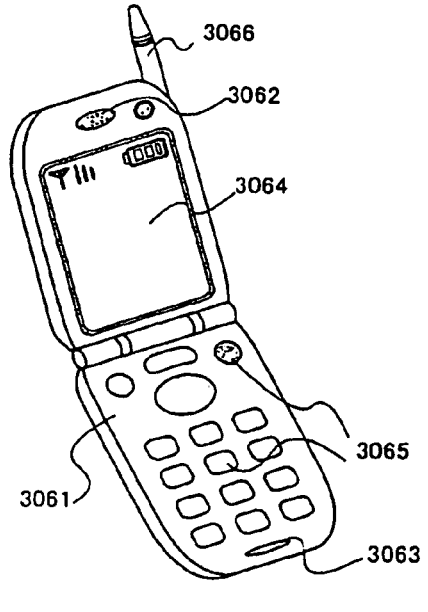
Figure 24F:
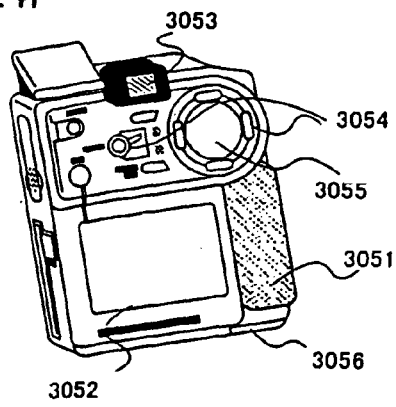

FIG. 24F is an example of completing a digital camera by applying the present invention, and is composed of a main body 3051, a display portion A 3052, an eye piece portion 3053, operation switches 3054, a display portion B 3055, a battery 3056 and the like. The TFT substrate manufactured by the present invention is applied to the display portion A 3502 and the display portion B 3055, and the digital camera can be completed by the present invention.

FIG. 24G is an example of completing a portable telephone by applying the present invention, and is composed of a main body 3061, an audio output portion 3062, an audio input portion 3063, a display portion 3064, operation switches 3065, an antenna 3066 and the like. The TFT substrate manufactured by the present invention is applied to the display portion 3064, and the portable telephone can be completed by the present invention.

Figure 25A:
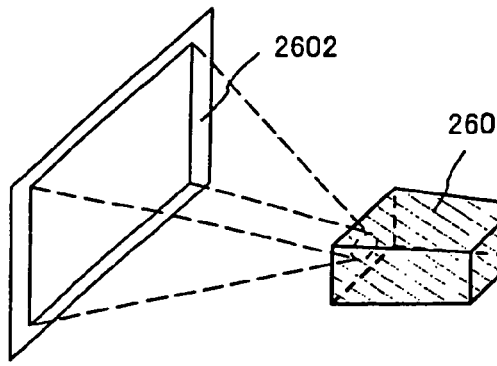
FIGS. 25A to 25D show examples of the semiconductor device.
Figure 25B:
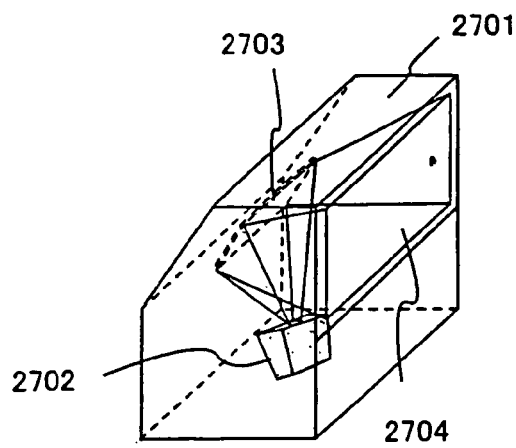

FIG. 25A shows a front type projector, which contains components such as a projecting apparatus 2601 and a screen 2602. FIG. 25B shows a rear type projector, which contains components such as a main body 2701, a projecting apparatus 2702, a mirror 2703, and a screen 2704.

Figure 25C:
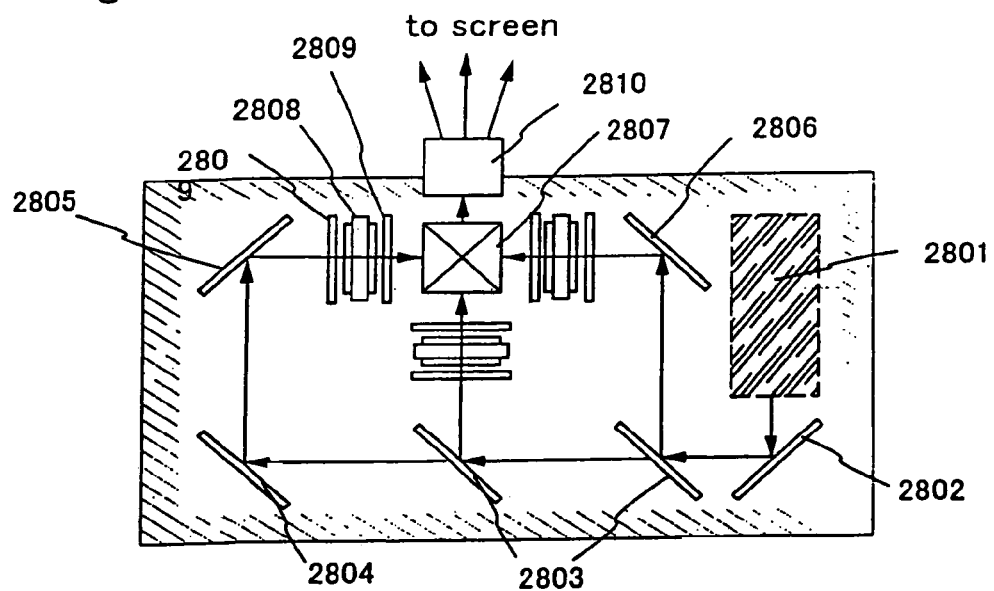

Note that an example of the structure of the projecting apparatuses 2601 and 2702 of FIG. 25A and FIG. 25B is shown in FIG. 25C. The projecting apparatuses 2601 and 2702 are composed of a light source optical system 2801, mirrors 2802 and 2804 to 2806, a dichroic mirror 2803, a prism 2807, a liquid crystal display device 2808, a phase difference plate 2809, and a projecting optical system 2810. The projecting optical system 2810 is composed of an optical system including a projecting lens. A three-plate type example is shown in the present embodiment, but there are no particular limitations, and a single-plate type may also be used, for example. Further, optical systems such as an optical lens, a film having a light polarizing function, a film for regulating the phase difference, and an IR film may be suitably placed in an optical path shown by an arrow in FIG. 25C by an operator.

Figure 25D:
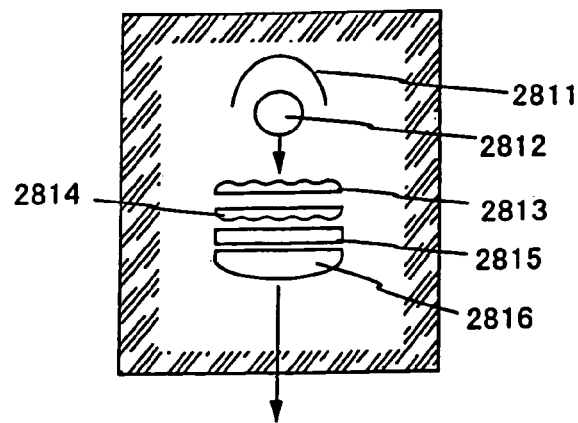

Furthermore, FIG. 25D is a diagram showing one example of the light source optical system 2801 in FIG. 25C. In the present embodiment, the light source optical system 2801 is composed of a reflector 2811, a light source 2812, lens arrays 2813 and 2814, a polarizing transformation element 2815, and a condenser lens 2816. Note that the light source optical system shown in FIG. 25D is one example, and the light source optical system is not limited to the structure shown in the figure. For example, optical systems such as an optical lens, a film having a light polarizing function, a film for regulating the phase difference and an IR film may be suitably placed in the light source optical system by an operator.

Note that, the electronic devices exemplified in the above is only an example, and the present invention is not limited to those use.

Embodiment 7

Figure 21:
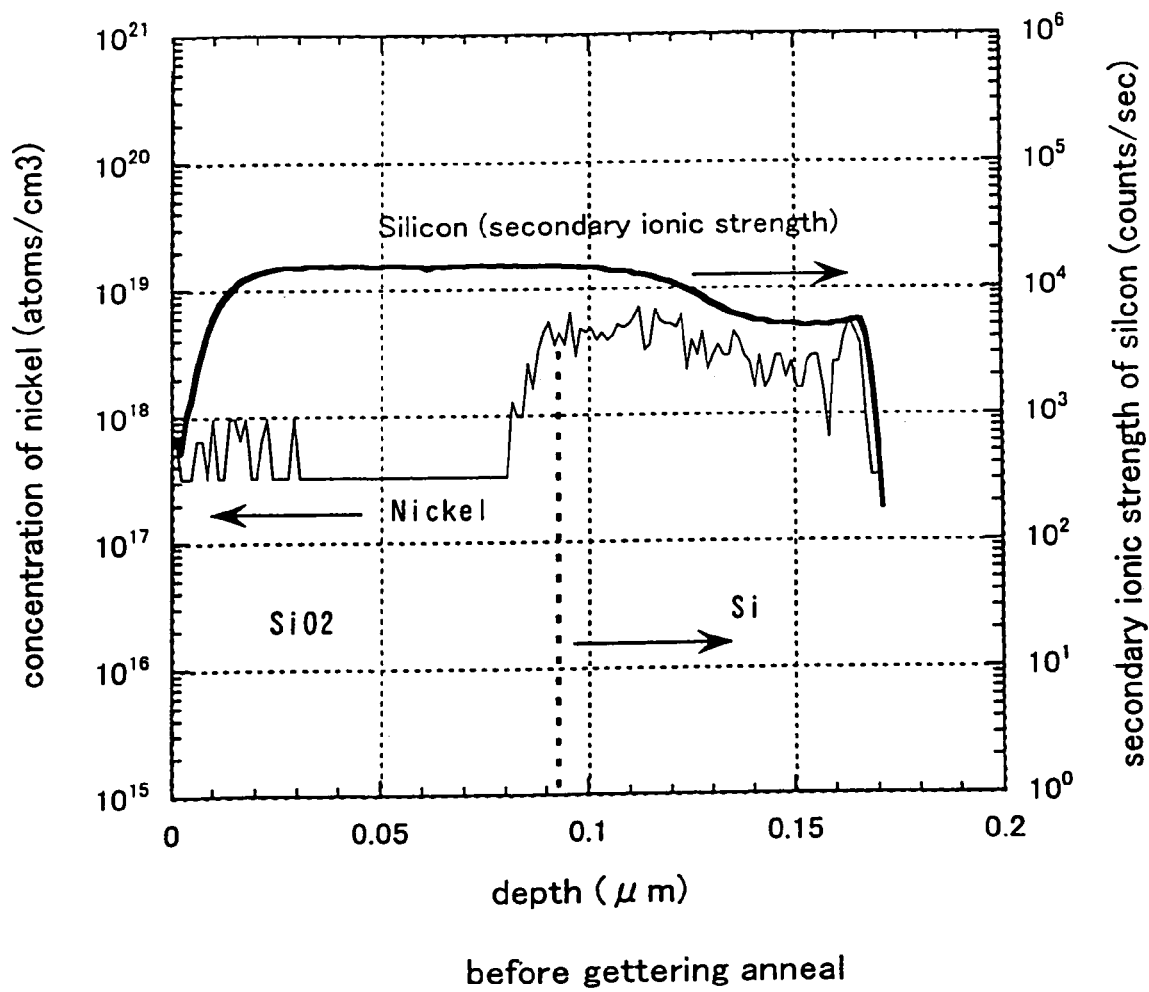
FIG. 21 shows a measurement result by a SIMS analysis, indicating an Ni concentration in a semiconductor region having a width of 50 im before second heat treatment.
Figure 22:
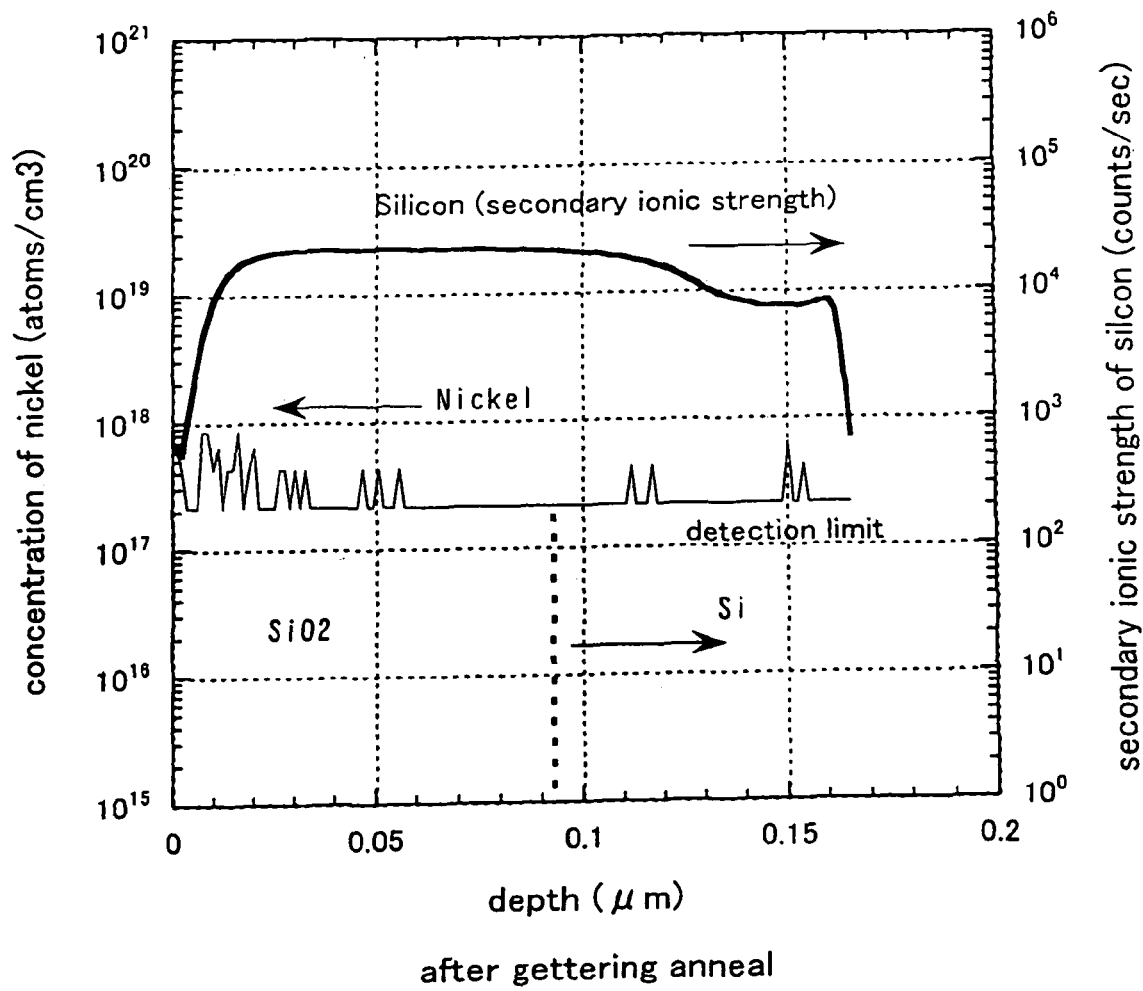
FIG. 22 shows a measurement result by the SIMS analysis, indicating the Ni concentration in the semiconductor region having the width of 50 im after the second heat treatment.
Figure 23A:
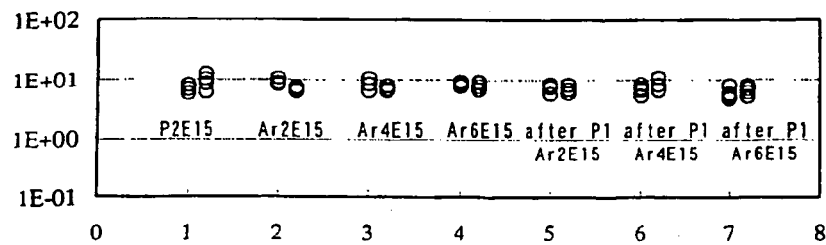
FIGS. 23A through 23E are graphs indicating several characteristics of a TFT manufactured by gettering using argon.
Figure 23B:
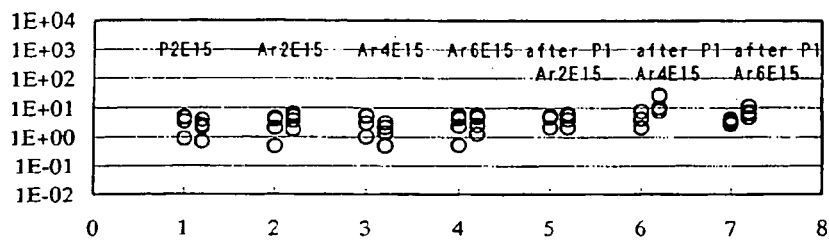
Figure 23C:
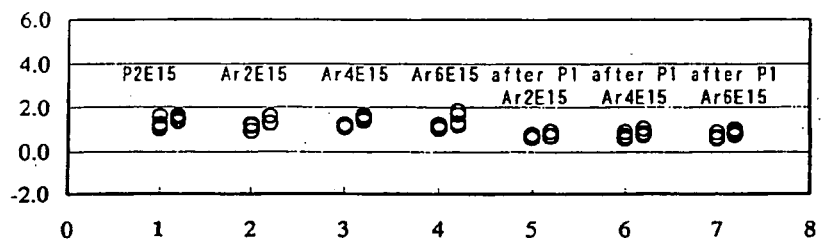
Figure 23D:
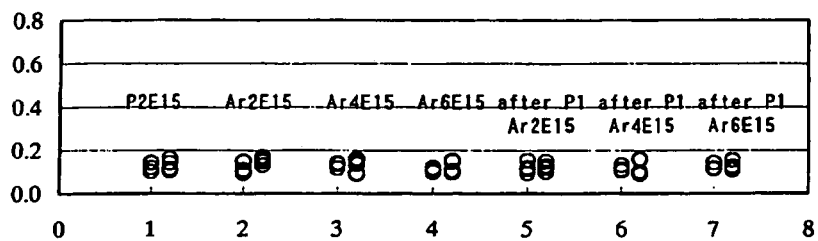
Figure 23E:
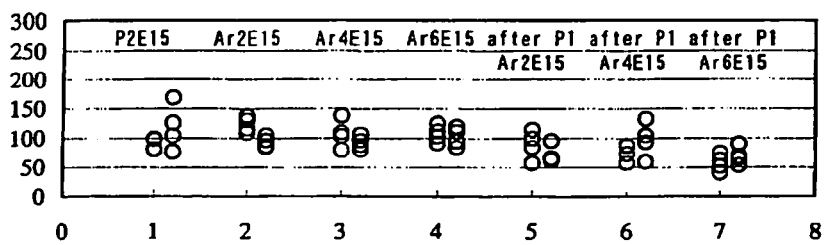

With respect to the crystalline semiconductor film obtained by the steps shown in FIGS. 6A to 6D and 7A to 7D, a gettering effect of a metal element used as a catalyst in crystallization, using argon as a noble gas element, is shown in FIGS. 21 and 22.

The crystalline semiconductor film formed in this embodiment is obtained by the following steps. That is, an amorphous silicon film with a thickness of 50 nm is deposited on a quartz substrate by a reduced pressure CVD method, Ni is added thereto at 5 ppm, dehydrogenation processing is performed at 450° C. for 1 hour, and then first heat treatment is performed at 600° C. for 12 hours to crystallize the amorphous silicon film. Thereafter, a mask insulating film as a silicon oxide film having openings is formed and argon ions are implanted through the openings at 10 kV and a dose of $2\times10^{15}/cm^2$. Second heat treatment is performed at 550° C. for 4 hours to segregate Ni in the region to which argon ions are implanted. An interval between the openings is 50 ìm. The concentration of nickel in a semiconductor region covered with the mask insulating film is quantitatively evaluated.

FIG. 21 shows a result obtained by measuring the concentration of Ni before the second heat treatment by a SIMS analysis and FIG. 22 shows a result of the concentration of Ni after the second heat treatment. As can be seen from these two graphs, it is clearly indicated that the concentration of Ni is reduced by the second heat treatment and the gettering effect is produced.

FIGS. 23A through 23E are graphs indicating several characteristics of an n-channel TFT manufactured using such a crystalline semiconductor film. A channel length and a channel width of the TFT are 8 ìm and 8 ìm, respectively. Even in the case of comparison of TFT characteristics gettered by phosphorus and argon, characteristics of TFT gettered by argon are almost the same as characteristics of TFT gettered by phosphorus, and thus similar gettering effect as one by phosphorus can be obtained by using argon of about $2\times10^{15}$ to $6\times10^{15}/cm^2$.

As described above, according to the intrinsic gettering performed by implanting the element belonging to the group 18 of the periodic table to the semiconductor film in the present invention, an effect such that the metal element left in the crystalline semiconductor film is gettered is extremely high. This can produce an increase in a purity of the crystalline semiconductor film formed using the metal element having a catalytic action and an improvement in productivity of a semiconductor device using the crystalline semiconductor film. The noble gas element is easy to use even in the case of ion doping. Since the noble gas element can be used without diluting it with a balance gas or the like, there is a characteristic such that a time required for doping is shortened.

Also, according to the intrinsic gettering performed by implanting the noble gas element to the semiconductor film in the present invention, an effect such that the metal element left in the crystalline semiconductor film is gettered is extremely high. This can produce an increase in a purity of the crystalline semiconductor film formed using the metal element having a catalytic action and an improvement in productivity of a semiconductor device using the crystalline semiconductor film. That is, the noble gas element is an inert gas and easy to use even in the case of ion doping. Further, there is a characteristic such that a time required for doping is shortened.

TABLE 1

| sample No. | P dope condition | | Ar dope condition | |
|---|---|---|---|---|
| | accelerating voltage | dose | accelerating voltage | dose |
| 1 | 80 keV | $1.5 \times 10^{15}/cm^2$ | — | — |
| 2 | 80 keV | $1.5 \times 10^{15}/cm^2$ | 90 keV | $2.0 \times 10^{15}/cm^2$ |
| 3 | 80 keV | $1.5 \times 10^{15}/cm^2$ | 90 keV | $4.0 \times 10^{15}/cm^2$ |
| 4 | — | — | 90 keV | $2.0 \times 10^{15}/cm^2$ |

What is claimed is:

1. A semiconductor device comprising:
   a crystalline semiconductor film over a substrate;
   a gate insulating film adjacent to the crystalline semiconductor film; and
   a gate electrode adjacent to the gate insulating film,
   wherein the crystalline semiconductor film comprises a channel forming region, a pair of first impurity regions including a one conductivity type impurity element adjacent to the channel forming region, and a pair of second impurity regions including the one conductivity type impurity element and sandwiching the channel forming region, and the pair of first impurity regions,
   wherein the pair of second impurity regions are located on end portions of the crystalline semiconductor film, respectively,
   wherein, in the crystalline semiconductor film, a noble gas element is only included in the second impurity regions, and wherein an outer side surface of each of the second impurity regions is in contact with the gate insulating film.

2. The semiconductor device according to claim 1, wherein the noble gas element is at least one selected from the group consisting of helium, neon, argon, krypton, and xenon.

3. The semiconductor device according to claim 1, wherein the noble gas element is included in the crystalline semiconductor film at a concentration of $1 \times 10^{19}$ to $1 \times 10^{21}/cm^3$.

4. The semiconductor device according to claim 1, wherein thickness of the crystalline semiconductor film is 10 to 100 nm.

5. A semiconductor device comprising:
a crystalline semiconductor film including a metal element over a substrate;
a gate insulating film adjacent to the crystalline semiconductor film; and
a gate electrode adjacent to the gate insulating film,
wherein the crystalline semiconductor film comprises a channel forming region, a pair of first impurity regions including a one conductivity type impurity element adjacent to the channel forming region, and a pair of second impurity regions including the one conductivity type impurity element and a noble gas element,
wherein the second impurity regions comprise the metal element at a higher concentration than the channel forming region and the first impurity regions,
wherein the pair of second impurity regions are sandwiching the channel forming region, and the pair of first impurity regions in the crystalline semiconductor film and each located on end portions of the crystalline semiconductor film,
wherein, in the crystalline semiconductor film, the noble gas element is only included in the second impurity regions, and
wherein an outer side surface of each of the second impurity regions is in contact with the gate insulating film.

6. The semiconductor device according to claim 5, wherein the metal element is at least one selected from the group consisting of Fe, Ni, Co, Ru, Rh, Pd, Os, Ir, Pt, Cu, and Au.

7. The semiconductor device according to claim 5, wherein the noble gas element is at least one selected from the group consisting of helium, neon, argon, krypton, and xenon.

8. The semiconductor device according to claim 5, wherein the noble gas element is included in the crystalline semiconductor film at a concentration of $1 \times 10^{19}$ to $1 \times 10^{21}/cm^3$.

9. The semiconductor device according to claim 5, wherein thickness of the crystalline semiconductor film is 10 to 100 nm.

10. A semiconductor device comprising:
a crystalline semiconductor film including a metal element over a substrate;
a gate insulating film adjacent to the crystalline semiconductor film; and
a gate electrode adjacent to the gate insulating film,
wherein the crystalline semiconductor film comprises a channel forming region and source and drain regions, each of the source and drain regions including a one conductivity type impurity element and being adjacent to the channel forming region,
wherein the source and drain regions include the metal element at a higher concentration than the channel forming region,
wherein, in the crystalline semiconductor film, a noble gas element is included in only the source and drain regions, and
wherein the whole of the source and drain regions include the noble gas element.

11. The semiconductor device according to claim 10, wherein the metal element is at least one selected from the group consisting of Fe, Ni, Co, Ru, Rh, Pd, Os, Ir, Pt, Cu, and Au.

12. The semiconductor device according to claim 10, wherein the noble gas element is at least one selected from the group consisting of helium, neon, argon, krypton, and xenon.

13. The semiconductor device according to claim 10, wherein the noble gas element is included in the crystalline semiconductor film at a concentration of $1 \times 10^{19}$ to $1 \times 10^{21}/cm^3$.

14. The semiconductor device according to claim 10, wherein thickness of the crystalline semiconductor film is 10 to 100 nm.

15. A semiconductor device comprising:
a blocking layer over a substrate
a crystalline semiconductor film on the blocking layer;
a gate insulating film adjacent to the crystalline semiconductor film;
a gate electrode adjacent to the gate insulating film;
a passivation film over, the crystalline semiconductor film, the gate insulating film, and the gate electrode,
wherein the crystalline semiconductor film comprises a channel forming region and source and drain regions adjacent to the channel forming region,
wherein the source and drain regions include a metal element at a higher concentration than the channel forming region,
wherein, in the crystalline semiconductor film, a noble gas element is included in only the source and drain regions, and
wherein the whole of the source and drain regions include the noble gas element.

16. The semiconductor device according to claim 15, wherein the noble gas element is at least one selected from the group consisting of helium, neon, argon, krypton, and xenon.

17. The semiconductor device according to claim 15, wherein the noble gas element is included in the crystalline semiconductor film at a concentration of $1 \times 10^{19}$ to $1 \times 10^{21}/cm^3$.

18. The semiconductor device according to claim 15, wherein thickness of the crystalline semiconductor film is 10 to 100 nm.

* * * * *

UNITED STATES PATENT AND TRADEMARK OFFICE
CERTIFICATE OF CORRECTION

PATENT NO. : 7,821,005 B2  
APPLICATION NO. : 11/404923  
DATED : October 26, 2010  
INVENTOR(S) : Shunpei Yamazaki et al.

Page 1 of 1

It is certified that error appears in the above-identified patent and that said Letters Patent is hereby corrected as shown below:

In the Specification:

Column 1, line 36, "7-1883540 is" should read "7-183540 is"

Column 3, line 34, "reunion to which" should read "region to which"

Column 9, line 67, "these inert eases has" should read "these inert gases has"

Column 12, line 51, "forming the Bettering" should read "forming the gettering"

Column 16, line 65, "passivation film 200" should read "passivation film 208"

Column 24, line 39, "suitably provide using" should read "suitably provided using"

Column 26, line 56, "display portion A 3502" should read "display portion A 3052"

Signed and Sealed this  
Twenty-fifth Day of June, 2013

Teresa Stanek Rea  
*Acting Director of the United States Patent and Trademark Office*